United States Patent [19]
Ribner et al.

[11] Patent Number: 5,142,286
[45] Date of Patent: Aug. 25, 1992

[54] READ-OUT PHOTODIODES USING SIGMA-DELTA OVERSAMPLED ANALOG-TO-DIGITAL CONVERTERS

[75] Inventors: David B. Ribner, Schenectady, N.Y.; Michael A. Wu, Waukesha, Wis.

[73] Assignee: General Electric Company, Schenectady, N.Y.

[21] Appl. No.: 590,845

[22] Filed: Oct. 1, 1990

[51] Int. Cl.⁵ .............................................. H03M 3/02
[52] U.S. Cl. .................................................... 341/143
[58] Field of Search .............. 341/143, 144, 118, 155; 375/30, 33, 29, 27, 77, 39, 44

[56] References Cited

U.S. PATENT DOCUMENTS

| | | | |
|---|---|---|---|
| 4,574,250 | 3/1986 | Senderowicz | 330/258 |
| 4,633,425 | 12/1986 | Senderowicz | 364/825 |
| 4,893,316 | 1/1990 | Janc et al. | 375/39 |
| 4,940,977 | 7/1990 | Mandell | 341/143 |

*Primary Examiner*—Sharon D. Logan
*Attorney, Agent, or Firm*—Marvin Snyder; James C. Davis, Jr.

[57] ABSTRACT

Sigma-delta analog-to-digital conversion is used in sensing apparatus that generates a digital signal descriptive of light energy received by a photosensor, such as one of a plurality of photosensors that together receive various elements of a radiant-energy image. A preamplifier generates an analog output signal responsive to the photocurrent of the photosensor, which analog output signal is undesirably accompanied by wideband noise. The analog output signal is supplied to a sigma-delta analog-to-digital converter, the decimation filter of which not only suppresses in the digital signal a component arising from the quantization noise from the sigma-delta modulator portion of the analog-to-digital converter, but also suppresses a component arising from remnant wideband noise from the preamplifier.

31 Claims, 9 Drawing Sheets

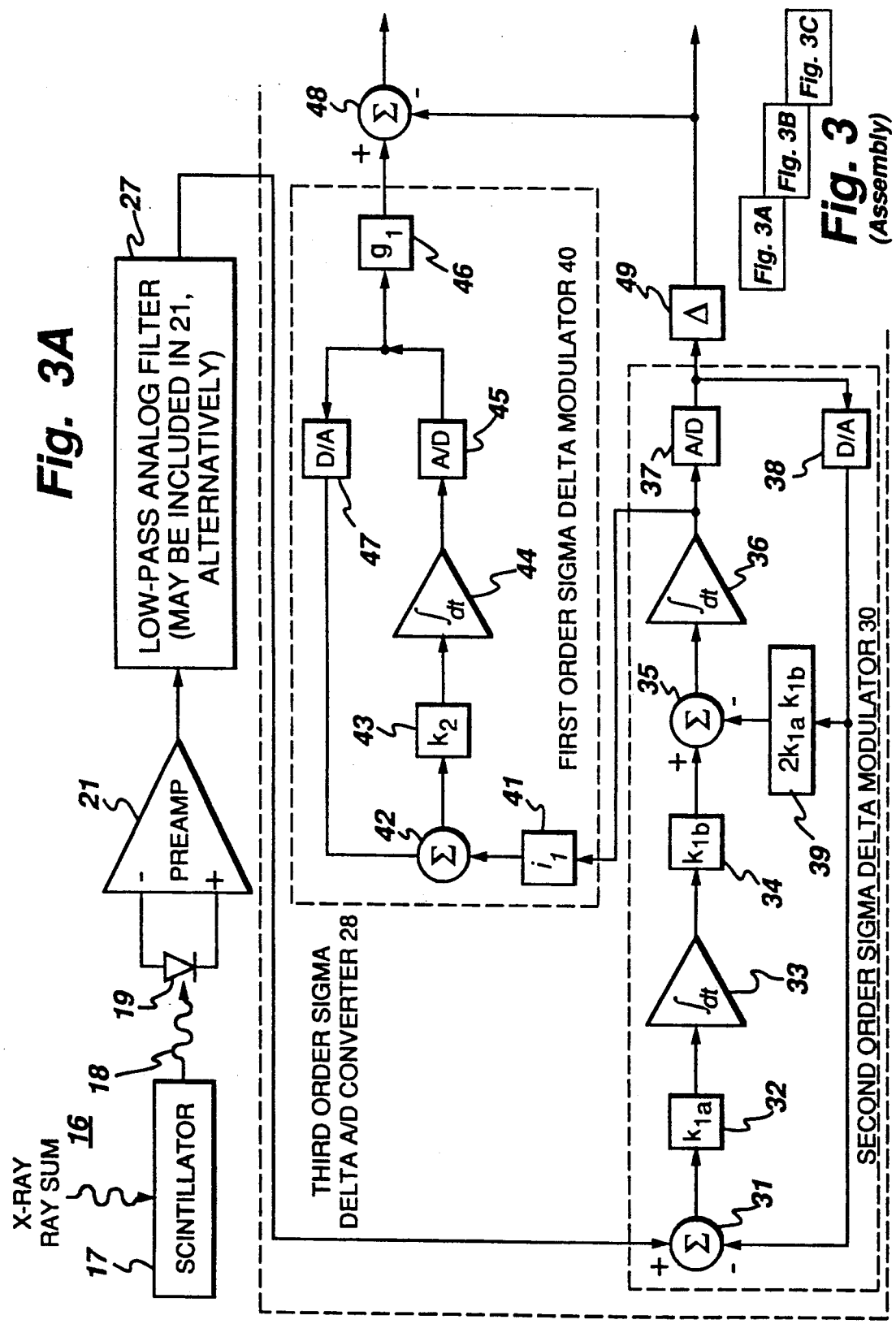

TABLE 1: NOISE BANDWIDTH vs. NUMBER N OF AVERAGED OUTPUTS, NO CROSSTALK

| NUMBER OF OUTPUTS (N) | INPUT SAMPLING RATE ($f_s$) | NOISE BANDWIDTH |
|---|---|---|
| 1 | 2.368 MHz | 2218 Hz |
| 2 | 2.959 MHz | 2067 Hz |
| 3 | 3.551 MHz | 1870 Hz |
| 4 | 4.143 MHz | 1737 Hz |
| 5 | 4.735 MHz | 1640 Hz |

*Fig. 4*

TABLE 2: NOISE BANDWIDTH vs. NUMBER N OF AVERAGED OUTPUTS, WITH CROSSTALK

| N | $f_s$ | CROSSTALK | NOISE BANDWIDTH |
|---|---|---|---|
| 1 | 1.184 MHz | 9.05% | 1108 Hz |
| 2 | 1.776 MHz | 4.33% | 1234 Hz |
| 3 | 2.368 MHz | 2.85% | 1249 Hz |
| 4 | 2.959 MHz | 2.12% | 1238 Hz |
| 5 | 3.551 MHz | 1.69% | 1227 Hz |
| 6 | 4.143 MHz | 1.40% | 1217 Hz |
| 7 | 4.735 MHz | 1.20% | 1214 Hz |

*Fig. 5*

READ-OUT PHOTODIODES USING SIGMA-DELTA OVERSAMPLED ANALOG-TO-DIGITAL CONVERTERS

CROSS REFERENCE TO RELATED APPLICATIONS

U.S. Pat. application Ser. No. 505,382 filed Apr. 6, 1990 by David B. Ribner and Richard D. Baertsch, entitled "HIGH ORDER SIGMA DELTA OVERSAMPLED ANALOG-TO-DIGITAL CONVERTER INTEGRATED CIRCUIT NETWORK WITH MINIMAL POWER DISSIPATION AND CHIP AREA REQUIREMENTS" and assigned to General Electric Company is hereby incorporated by reference. U.S. Pat. application Ser. No. 550,763 filed Jul. 10, 1990 by David B. Ribner, entitled "THIRD ORDER SIGMA DELTA OVERSAMPLED ANALOG-TO-DIGITAL CONVERTER NETWORK WITH LOW COMPONENT SENSITIVITY" and assigned to General Electric Company is hereby incorporated by reference. These previous disclosures provide construction details for third-order sigma-delta analog-to-digital converters as can be used to implement scanned read-out of an array of photodiodes in accordance with the invention.

U.S. Pat. application Ser. No. (RD-19,601) filed by David B. Ribner, entitled "NOISE-CANCELLING PHOTODETECTOR PREAMPLIFIER, AS FOR COMPUTERIZED TOMOGRAPHY" and assigned to General Electric Company is hereby incorporated by reference. This disclosure describes field-effect-transistor preamplifiers of integrating type suited for use after a photodiode and provided with correlated double sampling to suppress flicker (or 1/f) noise arising from the transistors.

BACKGROUND OF THE INVENTION

1. Field of the Invention

This invention generally relates to the scanned read-out of the photoresponses of photosensor arrays such as are employed in computed tomography systems and, more particularly, to the scanned read-out of the photoresponses in the digital rather than analog regime.

2. General Description of the Prior Art

CT scanners use a fan beam energy source, a central ray of which is projected through a particular point in space near the center of the object being scanned, as the energy source is stepped around a circular locus with center at that particular point in space. An arcuate strip of detector elements is located opposite the energy source on the other side of that particular point in space from the energy source and tracks the rotation of the energy source about that particular point in space. The object being scanned is always within the fan beam and absorbs a portion of the radiant energy in each contiguous segment of the fan beam, with the remnant radiant energy or "ray sum" in each segment of the fan beam being measured by a respective detector on the arcuate detector strip. The detector responses for each successive increment of rotation of the energy source and its opposing arcuate detector strip constitutes a separate "view" of the object being scanned. The detector responses during the successive views are digitized and stored in memory, since processing of these responses is not done in real time but rather is done after the scan is completed. During this subsequent processing the detector responses from each view are preweighted and prefiltered with a carefully formulated finite-impulse-response (FIR) filter kernel before being back projected into the image space to generate the gray scale values of the image picture elements or "pixels". The ray sums passing through each pixel center during each view are weighted and summed to create the gray scale value of the pixel by back projection. That is, since each ray sum represents the sum of the energy absorbed from a bundle of rays forming a segment of the fan beam in its traverse through successive portions of the object including the portion at which the pixel is located, the magnitude of the energy absorption ascribable to any one of the pixels traversed by that segment of the fan beam can be ascertained by performing an autocorrelation procedure involving all of the ray sums for bundles of rays passing through that pixel. This autocorrelation procedure suppresses the shadows cast by the pixels before and after the pixel of interest in the ray sums, which is the essence of producing a tomogram by computed tomography. In the additive combining of ray sums involved in implementing this autocorrelation procedure, each ray sum must be weighted to take into account the divergence of the fan beam before the ray packet associated with that pixel passes through that pixel.

Although the Fourier inversion approach to computed tomography has inherent speed advantage over back-projection reconstruction, it is considered to be unsuitable for use with the fan beam scanner because of excessive sensitivity to noise. The convolution and back-projection reconstruction method is suitable for view pipelining and yields images that are relatively free of undesirable artifacts from processing. A paper "Convolution reconstruction Techniques for Divergent Beams" by G.T. Herman, A.V. Lakshminarrayan and A. Naparstek appearing on pages 259-271 of COMPUTER BIOLOGIC MEDICINE, Vol 6, Oct. 1976, is of interest. So is a paper "Rapid Execution of Fan Beam Image Reconstruction Algorithms Using Efficient Computational Techniques and Special Purpose Processors" by B.K. Gilbert, S.K. Kenue, R.A. Robb, A. Chu, A.H. Lent and E.E. Swartzlander, Jr. appearing on pages 98-115 of the IEEE TRANSACTIONS ON BIOMEDICAL ENGINEERING, Vol. BME-28, No. 2, Feb. 1981.

The strip of detector elements includes a linear array of several hundred or so scintillators and a linear array of several hundred or so photodiodes arrayed behind the linear array of scintillators. The scintillators convert the x-ray image into a light image, and the photodiodes convert the photons in elements of this light image to electric charge. The photodiodes are provided with respective preamplifiers providing a low input impedance for sensing photodiode current and providing a low output impedance for driving subsequent circuitry. Filtering is carried out to suppress the out-of-band portions of the wideband noise originating within the preamplifiers and the photodiodes that precede them. Doing this filtering before A/D conversion avoids the noise generating an alias in the A/D converter which noise alias falls within band. Customarily sample and hold circuitry is provided before each A/D converter to hold each successive view sample throughout the time period needed to complete the A/D conversion.

In more recent CT systems sold by General Electric Company the photodiode-preamplifier combinations are apportioned amongst subgroups of the entire group of such combinations, and the analog output voltages from the preamplifiers in each subgroup are time-division multiplexed to the input port of a shared analog-to-digital (or A/D) converter. In practice it has proven to be difficult to match the conversion characteristics of the A/D converters for the various subgroups owing to the need for a very high number of bits (i.e., 16-20 bits) of resolution in converter output signals in order to perform the back-projection calculations. The linearity of the conversion characteristics of the A/D converters is made as good as possible, but differences in the conversion characteristics cause "banding artifacts" in the final tomogram if the photodiodes in each subgroup of photodiode-preamplifier combinations are adjacent to each other in the strip of detector elements. These banding artifacts appear as intensity variations with considerable lower spatial frequency, so they are objectionably noticable to a human viewer of the final tomogram. To reduce the visibility of artifacts attributable to differences in the A/D converter conversion characteristics, the practice has been to scramble the locations in the strip of detector elements of the photodiodes in each subgroup of photodiode-preamplifier combinations, so there is lessened likelihood of low-spatial-frequency components of these artifacts in the tomogram, but increased likelihood of higher-spatial-frequency components of these artifacts in the tomogram. The higher-spatial-frequency components of these artifacts may also be low-pass spatially filtered again, if desired, with loss only of some high-spatial-frequency detail in the tomogram. The practice of scrambling the connections of photodiode-preamplifier combinations to the time-division-multiplexed A/D converters leads to undesirably complex electrical interconnections amongst the elements of the CT system, however, complicating data transfer using time-division multiplexing via a high-speed digital bus.

The practice of scrambling the connections of photodiode-preamplifier combinations to the time-division-multiplexed A/D converters interferes with the desire to locate the preamplifier and A/D converter as close to the photodiode as physically possible, in order to help minimize the pick-up of extraneous electrical signals as noise. The A/D converter and the preamplifiers time-division multiplexed to it are normally constructed in monolithic integrated circuit (IC) form, and extensive cabling is needed to connect the photodiodes to this IC where the photodiode scrambling practice is followed. Since the output impedance level of a photodiode is of the order of 30 megohms, the pick-up of extraneous electrical signals on the cabling is likely to be appreciable.

An alternative method of lessening the likelihood of low-spatial-frequency components of the artifacts of differences of A/D converter conversion characteristics is to provide each of the photodiode-preamplifier combinations with its own A/D converter. This design approach eliminates the self-correlation of A/D converter conversion characteristics that promotes the generation of banding artifacts, though artifacts of non-linearity can still occur on a clumped basis. General Electric Company constructed each of about seventy of the earliest CT scanners sold under the 7800 system number, using a respective dual-slope A/D converter for each of the 300 photodiodes in its scanner array. As higher scanner resolution was sought and as the number of photodiodes in the scanner array went up, however, this design approach appeared less attractive. It presented the problem of designing an A/D converter with sufficient linearity and number of bits of usable resolution to provide tomograms with acceptably low artifacts attributable to differences in the A/D converter conversion characteristics, but which is of compact and cheap enough construction to be used by the hundreds in each CT scanner.

It is known that high-resolution A/D signal conversion can be achieved with lower resolution components through the use of oversampled interpolative (or sigma-delta) modulation followed by digital low-pass filtering and then by decimation. Oversampling refers to operation of the modulator at a rate many times above the signal Nyquist rate, whereas decimation refers to sub-sampling so as to reduce the sample rate to the Nyquist rate. The ratio R of oversampling rate to the signal Nyquist rate is denominated "oversampling ratio". Sigma-delta A/D converters having single-bit quantizers in the overall feedback loops of their sigma-delta modulators can have very linear conversion characteristics as has been described by the inventor Ribner in his U.S. application Ser. No. 513,452 filed Apr. 23, 1990, entitled "PLURAL-ORDER SIGMA-DELTA ANALOG-TO-DIGITAL CONVERTERS USING BOTH SINGLE-BIT AND MULTIPLE-BIT QUANTIZATION" and assigned to General Electric Company. Accordingly, it is pointed out here, matching of the conversion characteristics of a plurality of sigma-delta A/D converters can be done quite easily, by designing them to have single-bit quantizers in the overall feedback loops of their sigma-delta modulators.

Detailed general information about sigma-delta A/D converters can be obtained from the following technical articles which are hereby incorporated by reference.
1) "A Use of Limit Cycle Oscillators to Obtain Robust Analog to Digital Converters", J.C. Candy, IEEE Transactions on Communications, Vol. COM-22, No. 3, pp. 298-305, Mar. 1974
2) "Using Triangularly Weighted Interpolation to Get 13-Bit PCM from a Sigma-Delta Modulator", J.C. Candy, et al., IEEE Transactions on Communications, Vol. COM-24, No. 11, pp. 1268-1275, Nov. 1976
3) "A Use of Double Integration in Sigma Delta Modulation", J.C. Candy, IEEE Transactions on Communications, Vol. COM-33, No. 3, pp. 249-258, Mar. 1985.

In the sigma-delta A/D converter, resolution is predominantly governed by two factors: (1) the oversampling ratio R, and (2) the "order" of the modulator. In a CT scanner it is advantageous to use a higher-order modulator since the oversampling ratio R need not be quite so large; given that there are hardware limitations on how short the duration of individual samples can be made, reducing the number of samples required for obtaining a specified bit resolution from the sigma-delta A/D conversion will reduce the time taken to acquire complete view data. "Order" in the present context is analogous to the order of a frequency selective filter and indicates the relative degree of spectral shaping that is provided by the sigma-delta modulator. As with a filter, higher selectivity is obtainable with a higher-order modulator at the expense of increased hardware complexity, particularly in the decimation filter required to suppress quantization noise from the modulator. Indeed, an FIR digital filter design that is suited for use in the decimation filter of a sigma-delta modulator to provide selectivity against quantization noise has a sinc$^{(L+1)}(\omega T)$ response in the frequency domain where $\omega$ is radian frequency, T is the modulator period, and L is the order of the sigma-delta modulator. In line with commonplace terminology in the art of A/D converter design, sigma-delta modulators having an order of two or more are termed "higher-order" modulators in this specification and the appended claims.

In recognition of the resolution in the sigma-delta A/D converter being predominantly governed by oversampling ratio and by the "order" of the sigma-delta modulator, recent implementations of high-resolution oversampled analog-to-digital converters have employed both large oversampling ratios and higher-order sigma-delta modulators. However, practical considerations can limit the extent to which oversampling rate and modulator order can each be increased. For instance, for a given modulator clock rate (or oversampling rate), the oversampling ratio R is inversely proportional to the Nyquist rate after subsampling and thus cannot be made arbitrarily high without sacrificing conversion rate.

Different considerations set bounds on the modulator order. Implementations of order greater than two that use only a single quantizer can be shown to be only conditionally stable and are therefore not viable. Implementations of order greater than two that use more than one quantizer are described by the inventor in his U.S. application Ser. No. 513,452 filed Apr. 23 1990. Practical nonidealities—i.e., component mismatching, amplifier non-linearity, finite gain, excessive settling time, and limited signal dynamic range—normally limit resolution of prior-art higher-order sigma-delta analog-to-digital converter networks. U.S. Pat. application Ser. No. 550,763 filed Jul. 10, 1990, entitled "THIRD ORDER SIGMA DELTA OVERSAMPLED ANALOG-TO-DIGITAL CONVERTER NETWORK WITH LOW COMPONENT SENSITIVITY" and assigned to General Electric Company describes a third-order sigma-delta analog-to-digital converter network that exhibits significantly reduced sensitivity to these practical nonidealities.

The decimation filter included in the output circuitry of the sigma-delta A/D converter may simply be an accumulator operative as a simple integrator, or the decimation filter may be a sampled-data, low-pass, finite-impulse-response (FIR) filter followed by a subsampler. In either case, the decimation filter is a substantial, if not preponderant, portion of the entire sigma-delta converter as commonly constructed in metal-oxide-semiconductor integrated circuit form. The inclusion of the decimation filter makes the sigma-delta A/D converter compare unfavorably on a 1:1 basis with certain alternative integrated-circuit A/D converters from the standpoint of compactness. This is particularly so where the order of the sigma-delta A/D converter is higher and where the kernel of the FIR filter portion of the decimation filter includes a larger number of samples. The complexity of the decimation filter for a sigma-delta A/D converter is a factor that tends to lead one designing the electronics for a CT scanner to use a different type of A/D converter.

The inventor Ribner discerned that a sampled-data, low-pass, finite-impulse-response filter used in the decimation filter of the sigma-delta A/D converter can perform a dual function, by providing a substantial portion of the filtering needed to suppress high-frequency x-ray quantum noise and preamplifier noise before the detector responses are back projected into the image space to generate the gray scale values of the image picture elements or "pixels". Furthermore, the digital filtering otherwise needed to suppress high-frequency x-ray quantum noise and preamplifier noise generally has to have a sharp enough cut-off that it is comparable in complexity to the digital filtering required to suppress the quantization noise of a higher-order sigma-delta A/D converter. So, the digital low-pass filtering circuitry in the decimation filter can be eliminated from the comparison of the relative amounts of additional circuitry for a sigma-delta A/D converter and for alternative types of the sigma-delta A/D converter.

The inventor Ribner further discerned that sigma-delta A/D converters readily implement a CT scanner that can provide its operator increased bit resolution at the cost of increased image processing time. Such a CT scanner is implemented by changing the decimation filters to ones which have a different oversampling ratio.

Higher-order sigma-delta A/D converters of the type in which the decimation filter includes a sampled-data, low-pass, finite-impulse-response (FIR) filter followed by a subsampler have another problem that could lead one designing the electronics for a CT scanner to use a different type of A/D converter. Successive samples of the digital output signal from such a sigma-delta A/D converter tend to have considerable crosstalk between them because the kernel of the digital filter used to suppress higher-order quantization noise has to span more input samples (occurring at oversampling rate) than occur between successive output samples (occurring at a subsampled rate), as considered a pair at a time. This considerable crosstalk between successive output samples generated during successive views is a broadening of detector aperture that is unacceptable in CT scanner systems that use x-ray source wobbling. The back-projection reconstruction calculations cannot be carried out successfully in CT scanner systems that use x-ray source wobbling unless the successive view samples are more distinct from each other.

(Crosstalk between successive samples of the digital output signal from a sigma-delta A/D converter for sensor data is not as serious a problem in other image scanning systems, however. For example, in CT scanner systems that do not use x-ray source wobbling, the broadening of detector aperture caused by crosstalk between successive samples of the digital output signal from a sigma-delta A/D converter can be corrected for by spatial filtering, although the spatial filtering introduces additional noise into the system which can be avoided by minimizing crosstalk rather than using the spatial filtering. By way of example further afield, some image lag is tolerable in a television camera since there is some pixel-by-pixel integration in the eyes of the human viewer of a display generated from the camera output signal anyway.)

The inventors considered solving the crosstalk problem by increasing the oversampling rate by a factor $L+1$, presuming the order of the sigma-delta modulator is L and that the decimation filter of a sigma-delta modulator used to provide selectivity against quantization noise has a sinc$^{(L+1)}(\omega T)$ frequency response, while maintaining the same oversampling ratio R. The periodicity of the sampling and holding of each successive view sample prior to A/D conversion is left unchanged. This causes the sigma-delta A/D converter to generate L digital output samples with crosstalk, which are discarded; then a subsequent output sample with no crosstalk, which is retained; L digital output samples with crosstalk, which are discarded; then a subsequent output sample with no crosstalk, which is retained etc. The problem with this procedure, which discards all output samples but every $(L+1)^{th}$ ones, is that the concommitant increasing of the oversampling rate by the factor $L+1$ causes the equivalent noise bandwidth of the low-pass FIR digital filter in the decimation filter also to be increased by the factor $L+1$.

The inventors discerned that by increasing the oversampling rate by a factor $(L+N)$, presuming the order of the sigma-delta modulator is L and that the decimation filter of a sigma-delta modulator used to provide selectivity against quantization noise has a $sinc^{(L+1)}(\omega T)$ frequency response, the sigma-delta A/D converter would generate groups of N successive samples apparently free of intersample crosstalk interspersed by groups of L successive samples in which intersample crosstalk is apparent. By averaging the N successive samples apparently free of intersample crosstalk in each group and discarding the L successive samples in which intersample crosstalk is apparent, then subsampling by the factor $(L+N)$, discarding the L successive samples in which intersample crosstalk is apparent does not increase the equivalent noise bandwidth as much.

The inventor Wu discerned that in practice a better overall CT scanner design could be one which accepts some crosstalk between successive digital output samples.

The inventor Ribner discerned how to avoid undesirable noise aliasing when an integrating preamplifier is used after each photodiode instead of a transresistive preamplifier. The ramp outputs from the integrating preamplifier are applied directly to the sigma-delta A/D converter thereafter, rather than being synchronously detected beforehand, and the low-pass digital filtering afforded by the decimation filter of the sigma-delta A/D converter extracts an averaged response to the samples of each ramp output taken at oversampling rate.

SUMMARY OF THE INVENTION

The invention is embodied in sensing apparatus including a photosensor for responding to a respective element of a radiant-energy image for at least a prescribed period of time to generate a photocurrent; a preamplifier having an input port connected for receiving photocurrent from the photosensor and having an output port for supplying an analog output signal responsive to the photocurrent its input port receives, which output signal is undesirably accompanied by wideband noise originating in substantial part within the preamplifier; a sigma-delta modulator of order L, having an input port connected for receiving an analog input signal, and having an output port for supplying at an oversampling rate digital responses to the analog input signal, which responses are accompanied by quantizing noise generated within said sigma-delta modulator, L being an integer larger than zero; means for applying to the input port of the sigma-delta modulator as its received input signal the analog output signal from the output port of said preamplifier and at least a portion of the accompanying wideband noise, whereby the digital response of the sigma-delta modulator is accompanied by undesirable response to that at least a portion of the accompanying wideband noise as well as the quantizing noise generated within the sigma-delta modulator; and a decimation filter having an input port connected from the output port of the sigma-delta modulator and having an output port for supplying a decimation filter response at an output sample rate that is a submultiple of the oversampling rate, the oversampling rate being R times the output sample rate, R being an integer greater than one, in which decimation filter response a component arising from the accompanying wideband noise is attenuated respective to a component corresponding to the preamplifier analog output signal as well as the quantizing noise generated within the sigma-delta modulator being attenuated respective to the component corresponding to the preamplifier analog output signal. In preferred embodiments of the invention the decimation filter includes a Hogenauer filter (as hereinafter defined with reference to a paper by E.F. Hogenauer) followed by a supplemental filter that suppresses the apparent crosstalk between digital responses of the decimation filter.

BRIEF DESCRIPTION OF THE DRAWING

FIG. 3 which comprises FIGS. 3A, 3B and 3C, is a schematic diagram of a more sophisticated sensing apparatus embodying the invention and using a transresistive preamplifier after the photodiode.

FIGS. 4 and 5 are tables of both noise bandwidth and oversampling frequency for the FIG. 3 sensing apparatus, when no between-sample crosstalk is tolerated in its output samples and when some between-sample crosstalk is tolerated in its output samples, respectively.

Figure 1:
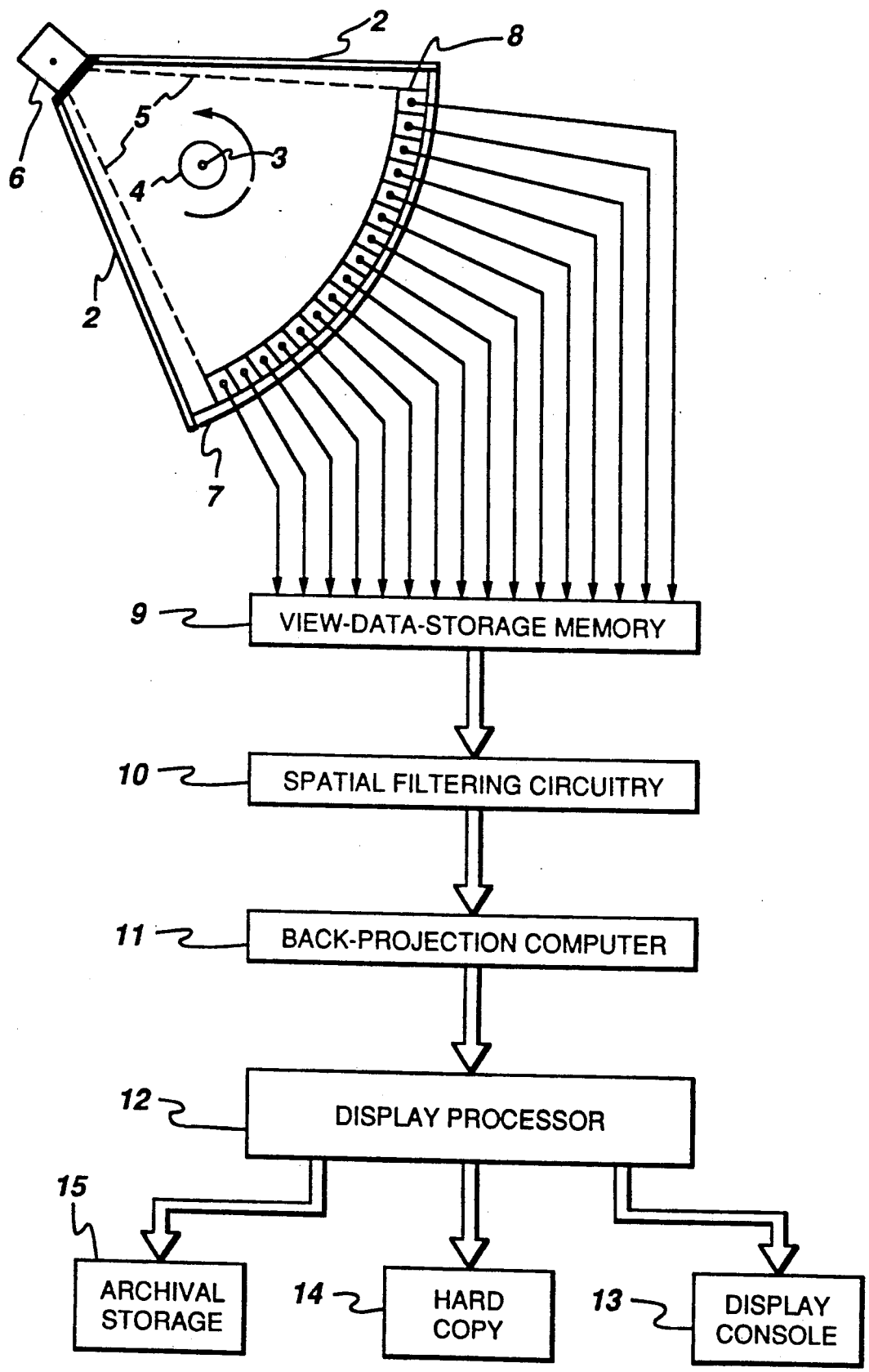
FIG. 1 is a schematic diagram of a computerized tomography scanner, as known in the prior art, which can be improved by being modified to incorporate the invention.

Solid-line electrical interconnections in the drawing carry data, and dashed-line electrical interconnections carry control signals. A circle with a sigma therein represents a signed adder, which may be an analog adder or a digital adder; and a rectangle with a delta therein represents a unit-sample delay, usually a clocked digital delay as afforded by a data (or D) flip-flop or the like.

DETAILED DESCRIPTION OF A PREFERRED EMBODIMENT OF THE INVENTION

The portion of FIG. 1 associated with elements 1-8 can be considered to be a cross-section through the mechanical portions of the FIG. 1 CT scanner. A gantry structure 2 rotates about an axis of rotation assumed to pass through point 3 perpendicularly to the plane of the paper bearing FIG. 1, this rotation being indicated by a arcuate arrow. An object 4 which is to be scanned by a fan beam of x-rays is arranged near the axis of rotation, and the gantry structure 2 rotates around the object 4 which is to be scanned. The rotating gantry structure 2 supports a source 6 of the fan beam 5 of x-rays at a remove from an arcuate baseplate 7, which source 6 and baseplate 7 rotate together with the gantry structure 2 to which they are fastened about the axis of rotation. This arcuate baseplate 7 has a row 8 of sensing apparatuses mounted thereon, each for generating a digital response to a respective ray sum—i.e., to the intensity of irradiation by a respective sector of the fan beam 5 of x-rays as shadowed by the object 4 being scanned. The invention concerns the particular nature of these sensing apparatuses, to be described further on in this specification.

In some CT scanners the source 6 supplies a fan beam 5 of x-rays that is fixed in position respective to the gantry structure 2 and the arcuate baseplate 7. In other CT scanners the source 6 supplies a fan beam 5 of x-rays that translates back and forth parallel to the chord of the arcuate baseplate 7, translating to one limit of travel for odd-numbered successive views and translating to the other limit of travel for even-numbered successive views, which procedure is referred to as "source wobbling".

Conventionally, the rotation of the gantry structure 2 is considered to be a stepped rotation with the times between steps of rotation being referred to as view times. The digital responses of the row 8 of sensing apparatuses during the successive view times are communicated to a view data storage memory 9, which is usually a semiconductor random access memory (RAM), and stored until completion of the scanning procedure. The scanning procedure is completed, after the arcuate baseplate 7, the rotating gantry structure 2 and the fan-beam source 6 have completed one complete revolution around the axis of rotation passing through point 3.

The view data from the view data storage memory 9 are then supplied to spatial filtering circuitry 10 which converts the fan-beam view data to resemble narrow pencil-beam view data. The spatial filtering is done convolving the fan-beam data with a filter kernel that has a large number of samples width. Because of the width of the filter kernel, the spatial filtering is preferably carried out by calculating a fast discrete Fourier transform (DFT) of the fan-beam data, multiplying that DFT by the DFT of the filter kernel, and by calculating a fast inverse DFT of the product to arrive at the convolution result. In medical computerized tomography the spatial filtering is usually followed by beam hardening and bone beam hardening procedures, which do not have to be considered to understand the operating environment of the invention.

A back-projection computer 11 responds to filtered view data supplied by the spatial filtering circuitry 10 to generate the gray scale values of the image picture elements or "pixels" in digital form. The digital pixel information is supplied to a display processor 12 that converts the digital pixel information to analog television signals supplied to a display console for the operator of the scanner. The display processor 12 also converts the digital pixel information to signals to apparatus 14 for making hard copies of the scanner results. The display processor 12 may also prepare data for archival storage apparatus 15.

Figure 2:
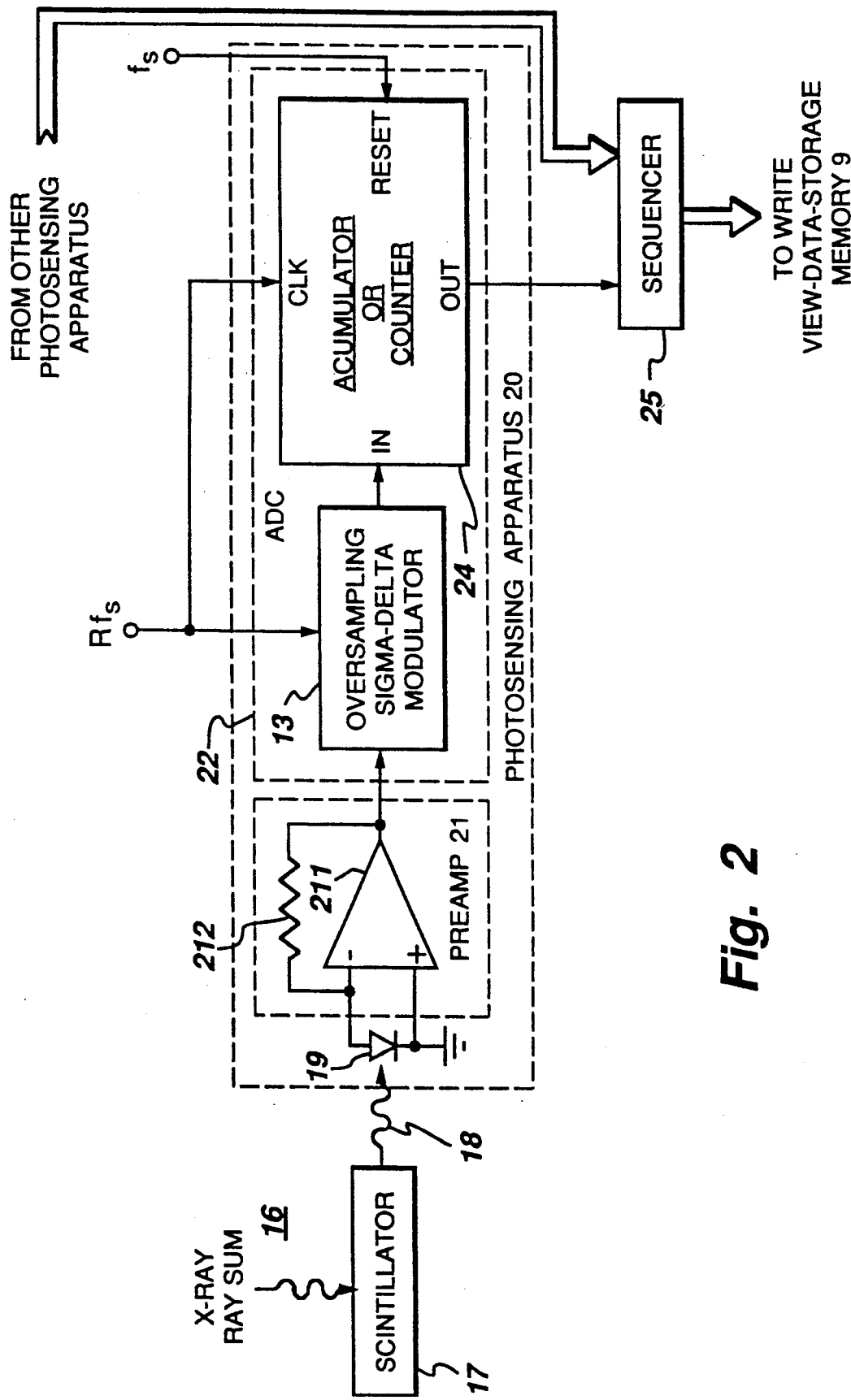
FIG. 2 is a schematic diagram of a simple sensing apparatus embodying the invention and using a transresistive preamplifier after the photodiode.

FIG. 2 shows a ray sum 16 of x-rays impinging on a scintillator 17 to cause a flow 18 of photons to an adjacent photodiode 19 at the head end of a photosensing apparatus 20. The photosensing apparatus 20 is used to generate a digital response that is a measure of the flow 18 of photons to the photodiode 19. The photocurrent generated in the reverse direction across the junction of the photodiode 19 is amplified in a preamplifier 21, which is a low-noise amplifier shown to be of transresistance type comprising an operational amplifier 211 and a feedback resistor 212 for determining the transresistance characteristic. More generally the preamplifier 21 may be considered to be of transimpedance type, and variants where the feedback resistor 212 is accompanied by one or more frequency-shaping capacitors are possible. Preamplifier 21 supplies from its output port an output voltage that measures the flow of photocurrent to its input port from the photodiode 19. This output voltage is undesirably accompanied by some wideband noise, no matter how low-noise the preamplifier is.

The photodiode connected to the input of preamplifier 21 has an undesirable finite shunt impedance. This shunt impedance consists of the diode junction capacitance in parallel with the diode shunt resistance. This finite impedance causes the gain for the input-referred voltage noise of the operational amplifier in preamplifier 21 to increase from unity to $$A_v(S) = 1 + \frac{R_F}{Z_D} = \left(\frac{R_D + R_F}{R_D}\right) + s R_F C_D$$

where $Z_D$ is THE diode shunt impedance, $R_D$ is the diode shunt resistance, $C_D$ is the diode junction capacitance, and $R_F$ is the resistance of feedback resistor 212. The photodiode shunt resistance causes the low-frequency noise contribution of the operational amplifier to increase significantly as $R_D$ decreases from infinity and approaches the value of $R_F$. This effect is particularly detrimental where the field effect transistors in the input stage of the operational amplifier are metal-oxide-semiconductor types, since such transistors demonstrate low-frequency flicker (or 1/f) noise in addition to wideband thermal noise. $C_D$ along with the parallel combination of $R_D$ and $R_F$ causes a zero in the noise gain frequency response and a corresponding boosting of high-frequency amplifier noise. It is therefore desirable to make $R_D$ as large as possible (to reduce DC noise gain and to reduce its thermal noise) and $C_D$ as small as possible (to push the boosting of amplifier noise to higher frequencies, where it can be more effectively filtered).

The photodiode capacitance can be reduced somewhat by operating it with some reverse bias, without modifying the structure of the photodiode, but the photodiode capacitance can also be reduced through structural improvements in the photodiode. A modern photodiode has a structure similar to a PIN diode constructed on an N-type substrate, in which capacitance is determined by the thickness and purity of the intrinsic layer in which photocarriers are induced. To reduce the capacitance of the photodiode, the junction area used for collecting photocarriers is reduced. Reducing junction area reduces dark current or, in the case where zero bias operation is used (as shown in FIGS. 2 and 3), causes an increase in diode shunt resistance; in either case diode thermal noise is reduced. To retain collection efficiency for photocarriers despite reduced area of the junction used for collecting photocharge, doping gradients are introduced to keep the photocarriers generated in the lightly doped N-type epitaxial layer (i.e., the intrinsic layer) from recombining in the front or back surfaces before their collection. (See U.S. Pat. No. 4,146,904 issued Mar. 27, 1979 to R.D. Baertsch, D.M. Brown & M. Garfinckel; entitled "RADIATION DETECTOR" and assigned to General Electric Company.)

In prior-art photosensing apparatus sharp-cutoff low-pass analog filters have been used before analog-to-digital conversion is performed to generate the digital output signal of photosensing apparatus 20, to filter the analog output voltage from the preamplifier 21 to suppress the accompanying wideband noise. A sharp-cutoff analog filter is a multiple-section filter with a large number of poles (and often zeros) in its response in the complex frequency domain. The low-pass analog filtering suppresses an above-band portion of the wideband noise from preamplifier 21. This portion is located in the part of the frequency spectrum higher than baseband, in which baseband the signals of interest reside. The filtering prevents the aliasing of that above-band portion of the wideband noise to baseband during the analog-to-digital conversion; in an analog-to-digital conversion that is not an oversampling A/D converter, there is no attenuation of this noise alias respective to preamplifier 21 output signal voltage.

Analog-to-digital conversion of the preamplifier 21 output voltage is provided in FIG. 2 by an oversampling analog-to-digital converter 22 consisting of an oversampling sigma-delta modulator 23 generating output samples at an oversampling rate of R times $f_v$, the view rate, R being an integer equal to two raised to a positive integral power, and an accumulator 24 accumulating sigma-delta modulator 23 digital output signal and being reset to zero at $f_v$ rate. From the standpoint of guaranteeing conversion linearity it is preferable that the sigma-delta modulator 23 is of a type using a single-bit quantizer to determine its output signal, in which case the sigma-delta modulator 23 generates a bit-serial output signal and the accumulator 24 is simply a counter for ONEs. The accumulator 24 provides a low-pass filtering function with a rectangular impulse response in the time domain. In the frequency domain, respective to preamplifier 21 output signal voltage, the accumulator 24 attenuates the above-band portion of the wideband noise from preamplifier 21 by a factor substantially equal to the square root of R, as that above-band portion of the wideband noise appears in an alias to baseband.

The oversampling analog-to-digital converter 22 supplies the digital response to preamplifier 21 output voltage with its attenuated wideband noise as the output signal of photosensing apparatus 20 to a sequencer 25. The sequencer 25 places the output signal of photosensing apparatus 20 in sequence with the output signals from other photosensing apparatuses, time-division multiplexing them onto a digital bus connecting to write view-data-storage memory 9. By way of example the sequencer 25 comprises a parallel-in/serial-out register or "side-loaded shift register" for each bit slice of the output signals from the photosensing apparatuses. As described in detail in U.S. Pat. application Ser. No. 358,300 filed May 30, 1989 BY W-T. Lin, entitled "PARALLEL COMPUTATION OF FAN-BEAM BACK-PROJECTION RECONSTRUCTION ALGORITHM IN COMPUTED TOMOGRAPHY" and assigned to General Electric Company the view-data-storage memory 9 may be segmented into component memories, each for storing view data from a particular subrow portion of the row 8 of sensing apparatuses. In such case each component memory is provided with a respective sequencer 25 receiving the digital output signals only from all the sensing apparatuses in one subrow. The writing of data in parallel into segments of the view-data-storage memory 9 not only facilitates that memory being written more rapidly; the reading of data in parallel from segments of the view-data-storage memory 9, which is subsequently easy to implement, facilitates parallel computation in the spatial filtering circuitry 10 and back projection computer 11, supposing source wobbling is not used.

The accumulator 24 has a rectangular impulse response, or sinc(wT) frequency response, and does not tend to exhibit crosstalk between successive subsamples supplied to the sequencer 25. The $(\omega T)^{-1}\sin(\omega T)$ or sinc(wT) response of accumulator 24 does not provide as selective filtering against quantization noise as is preferred, however, particularly for higher-order sigma-delta modulators. An FIR digital filter design that is preferred for use in the decimation filter of a sigma-delta modulator to provide selectivity against quantization noise has a $\text{sinc}^{(L+1)}(\omega T)$ response in the time domain, where $\omega$ is radian frequency, T is the modulator period and equals $1/Rf_s$, and L is the order of the sigma-delta modulator. The more selective filters tend to exhibit crosstalk between successive subsamples supplied to the sequencer 25, however, unless proper precautions are observed.

Figure 3B:
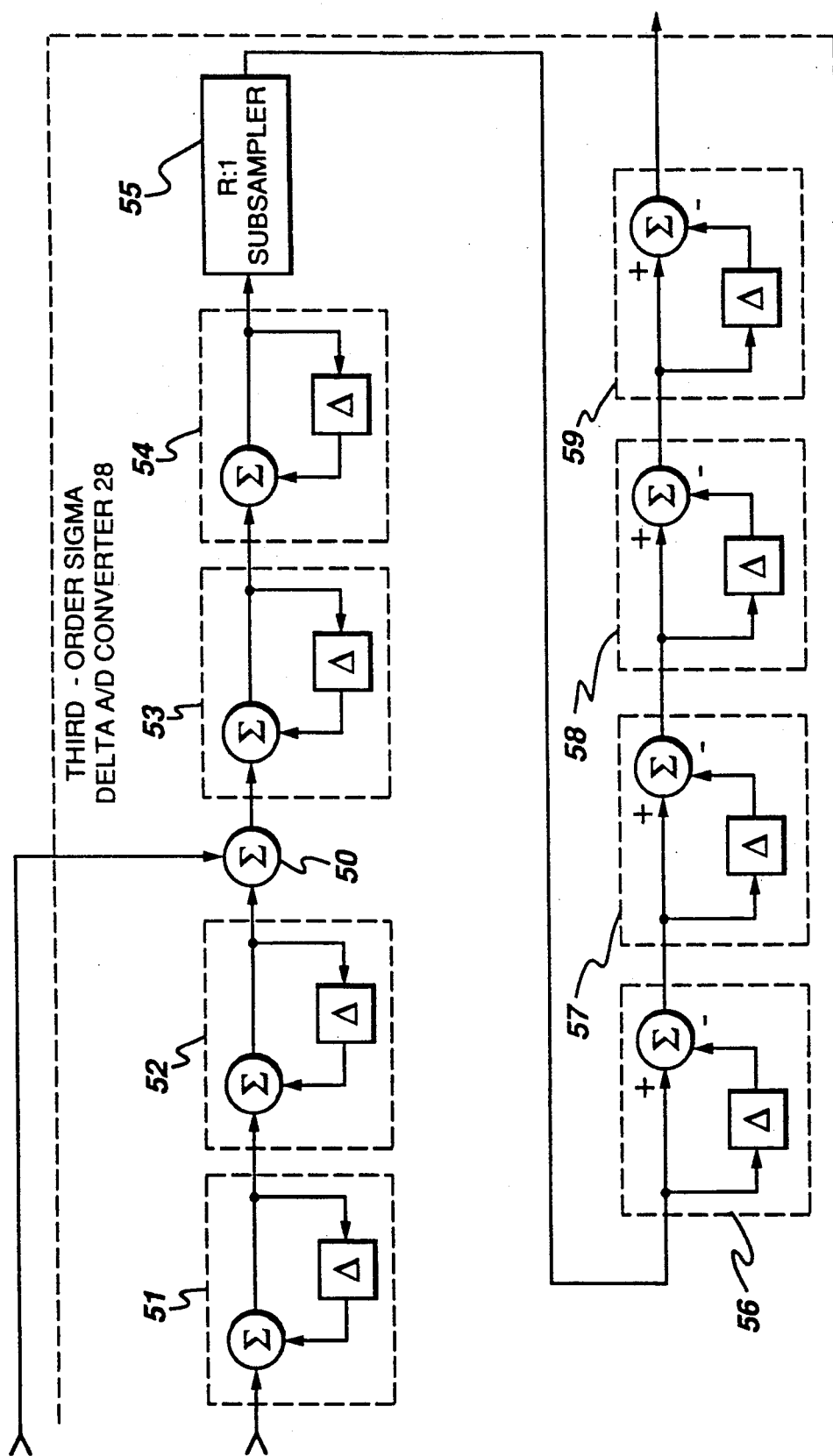

FIG. 3 shows in the FIG. 3A portion thereof the amplified photoresponse generated by the scintillator 17, the photodiode 19 and the preamplifier 21 being subjected to preliminary filtering with an analog low-pass filter 27 and the response of the analog filter 27 being applied as input signal to a third-order sigma-delta modulator 28. E. F. Hogenauer described a class of digital decimation filters that use minimal storage and no multipliers and thus can be implemented very efficiently in a paper "An economical class of digital filters for decimation and interpolation", IEEE Transactions on Acoustics, Speech and Signal Processing, Vol. ASSP-29, No. Apr. 2, 1981. FIG. 3 shows in the FIG. 3B portion thereof a digital filter of this class with a $\text{sinc}^4(wT)$ response, which is used to suppress the component of the third-order sigma-delta modulator 28 output signal corresponding to the quantization noise of modulator 28. The use of a filter of this class as the decimation filter for a sigma-delta A/D converter is described by E. Dijkstra, O. Nye, C. Piguet and M. Degrauwe in their Paper "On the Use of Modulo Arithmetic Comb Filters in Sigma-delta Modulators" in pages 2001–2004 of the Proceedings of the IEEE Conference on Acoustics, Speech and Signal Processing, 1988. For convenience and for no other purpose, digital filters of this class will hereinafter be referred to as "Hogenauer" filters at certain points in this specification.

In accordance with the invention, the $\text{sinc}^4(\omega T)$ response of the FIG. 3B digital low-pass filter is also used to suppress the component of the third-order sigma-delta modulator 28 output signal corresponding to the wideband noise from the preamplifier 21 remnant after filtering with the analog filter 27. The third-order sigma-delta modulator 28 is of a form that twice integrates the digitized analog input signal therefrom in the FIG. 3B digital low-pass filter before cancelling quantization noise, as described in greater detail by D. B. Ribner in connection with FIGS. 11 and 12 of his above-cited U.S. Pat. application Ser. No. 550,763 filed Jul. 10, 1990. The substantial selectivity against wideband noise provided by the sinc$^4(\omega T)$ response of the FIG. 3B digital low-pass filter reduces the need for filtering the analog input signal to the third-order sigma-delta modulator 30, so the analog low-pass filter 27 can be made a simple one- or two-section resistance-capacitance (RC) filter. Indeed, alternatively, preamplifier 21 itself may be constructed to include the roll-off of high frequency response needed before sigma-delta conversion in order to avoid an unacceptably strong noise alias to baseband, so the analog low-pass filter 27 may be dispensed with. Of course, an analog band-rejection filter may be used to remove from modulator 28 input signal the portions of the wideband noise spectrum giving rise to noise aliasing into baseband, instead of using, or in addition to using, the analog low-pass filter 27.

The third-order sigma-delta modulator 28 of FIG. 3 includes a component second-order modulator 30 and a component first-order modulator 40. The second-order component sigma-delta modulator 30 includes an analog subtractor 31 receiving analog input signal as minuend, an amplitude-scaling element 32 for scaling the difference from the subtractor 31 by a factor $k_{1a}$ in the analog domain, an integrator 33 for the response of the amplitude-scaling element 32, an amplitude-scaling element 34 for scaling the difference from the integrator 33 by a factor $k_{1b}$ in the analog domain, an analog subtractor 35 receiving as a minuend the response of the amplitude-scaling element 34, an integrator 36 for the difference supplied by the subtractor 35, a quantizer or analog-to-digital (A/D) converter 37 to generate a digital output signal for the second-order modulator 30 from the output signal of integrator 36, and a digital-to-analog (D/A) converter 38 for converting the digital output signal of the second-order modulator 30 back to analog form for use in applying negative feedback. An amplitude-scaling element 39 scales the analog output signal of D/A converter 38 by a factor $2k_{1a}k_{1b}$ in the analog domain before its application as subtrahend to the analog subtractor 35 closing an internal feedback loop for the second-order component sigma-delta modulator 30. The analog output signal of D/A converter 38 is applied as subtrahend to subtractor 35 closing an external feedback loop for the second-order component sigma-delta modulator 30.

The first-order component sigma-delta modulator 40 includes an amplitude-scaling element 41 for scaling the analog output signal of the integrator 36 by a factor $j_1$ in the analog domain, an analog subtractor 42 receiving as minuend the response of the amplitude-scaling element 41, an amplitude-scaling element 43 for scaling the difference from the subtractor 42 by a factor $k_2$, an integrator 44 for the response of the amplitude-scaling element 43, a quantizer or analog-to-digital (A/D) converter 45 for the the output signal of integrator 44, an amplitude-scaling element 46 scaling the digital output signal of the quantizer 45 by a factor $g_1 = 1/j_1 k_{1a} k_{1b}$ in the digital domain, and a digital-to-analog (D/A) converter 47 for converting the digital output signal of the first-order modulator 40 back to analog form to be applied as subtrahend to the subtractor 42, thus closing a feedback loop for the first-order component sigma-delta modulator 40.

The scaled digital output signal from the scaling element 46 is supplied as minuend to a digital subtractor 48. Subtractor 48 is supplied, as subtrahend, the digital output signal of the component second-order modulator 30 after its being delayed one sample time in a clocked digital delay element 49. Subtractor 48 supplies, as its difference output signal, the negative of the twice-integrated quantization noise of the second-order component sigma-delta modulator 30. The subtractor 48 difference output signal provides an augend for a digital adder 50 located in FIG. 3B.

The digital output signal of the component second-order modulator 30 in FIG. 3A, as delayed one sample time in the clocked digital delay element 49, is the digitized analog input signal received by modulator 28. In FIG. 3B the delayed modulator 30 digital output signal is twice integrated respective to time in cascaded integrators 51 and 52 to generate an augend for the digital adder 50. The second-order quantization noise generated by the component second-order modulator 30 is substantially cancelled out in the digital sum signal from the digital adder 50. The reasons for this cancellation and variants of the third-order sigma-delta converter 28 are described in greater detail in U.S. Pat. application Ser. No. 550,763 filed Jul. 10, 1990.

An Mth-power Hogenauer filter is composed of a cascade of M integrator stages clocked at the input sampling rate followed by M differentiator stages clocked at the reduced output rate. The ratio of the input rate to the output rate is called the rate change factor or oversampling ratio, R.

The transfer function for such a filter is $$H(z) = \left[ \sum_{k=0}^{R-1} z^{-k} \right]^M = \left[ \left( \frac{1 - z^{-R}}{1 - z^{-1}} \right) \right]^M$$

The order of such a filter is $[(R-1)M]^{th}$, the order of the polynomial in z defining its transfer function. The impulse response of such a filter is RM samples long at the input rate or M samples long at the reduced output rate. Typically the filter response is normalized in amplitude, by dividing by $R^M$ somewhere along or after the cascaded M differentiator stages.

In FIG. 3 (more particularly, in FIG. 3B) a Hogenauer filter in which M is four is used. In accordance with the general rule set forth previously, a fourth-power Hogenauer filter is composed of a cascade of four integrator stages clocked at the input sampling rate followed by four differentiator stages clocked at the reduced output rate. In FIG. 3 the cascade of four integrator stages clocked at the input sampling rate includes cascaded integrators 53 and 54 following the digital adder 50 as well as the cascaded integrators 51 and 52 preceding the digital adder 50. The quadruply integrated digitized response to analog-filtered preamplified photocurrent supplied from the integrator 54 is subsampled R:1 in a subsampler 55. The response at output sample rate is then quadruply differentiated in cascaded differentiators 56, 57, 58 and 59 to generate a Hogenauer filter output response shown as having its amplitude-normalization deferred.

An Mth-power Hogenauer filter structure results in a filter with an impulse response which is M samples long at the decimated sample rate. For filter orders greater than one, this results in a great deal of crosstalk from one output sample to the next. The basic Mth-power Hogenauer filter can be followed by a supplemental filter used to substantially reduce or completely eliminate this crosstalk, while retaining the implementation efficiency of the Hogenauer structure.

Figure 3C:
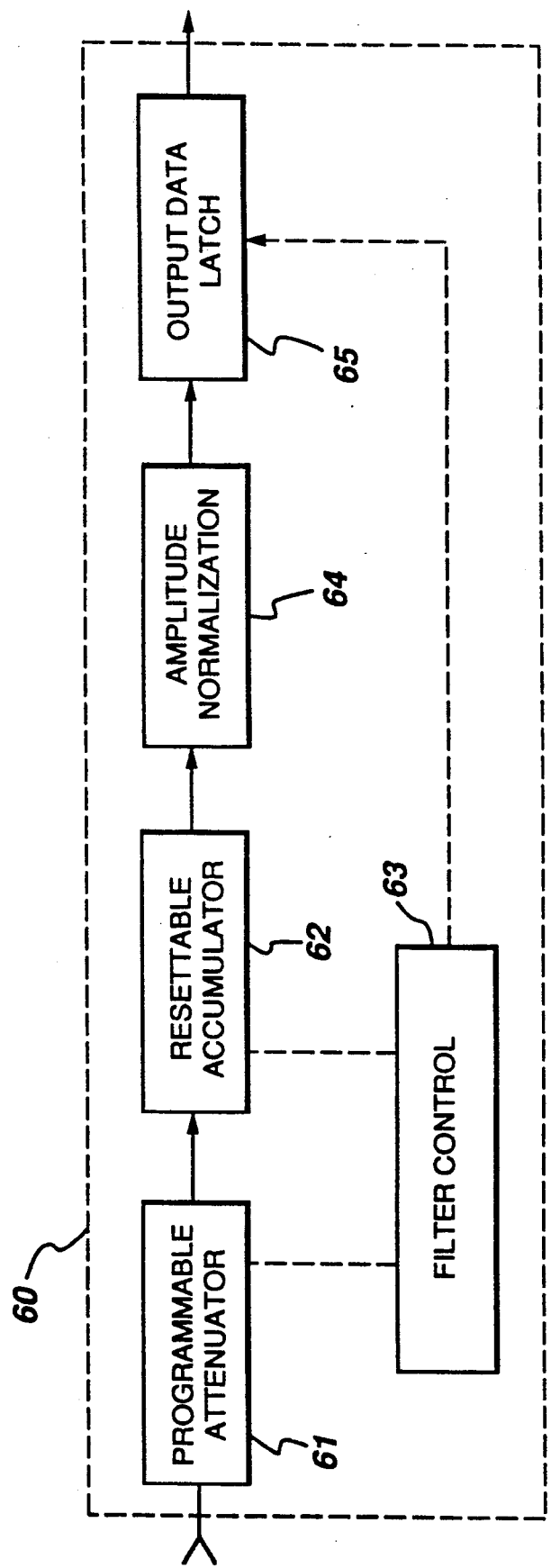

In FIG. 3 the basic Mth-power Hogenauer filter is followed by a supplemental filter 60. The supplemental filter 60 shown particularly in FIG. 3C comprises an programmable attenuator 61 and a resettable accumulator 62 both under control of filter control circuitry 63 and provides a decimated finite-impulse response. The data rates are usually low enough that one could alternatively use one of the canonic forms of output-weighted or input-weighted finite-impulse-response (FIR) digital filters, formed using a tapped delay line and digital adders, followed by a subsampler. The supplemental filter 60 shown particularly in FIG. 3C generates a weighted summation only in the subsampling regime, and at its simplest the programmable attenuator 61 weights only by one or by zero. More sophisticated filter responses can be obtained with the programmable attenuator 61 being one comprising a digital muliplier with memory for storing the weights associated with the filter kernel. The supplemental filter 60 further includes amplitude-normalization circuitry 64, which provides for attenuation by $R^M$ to compensate for non-unity gain in the FIG. 3B Hogenauer filter, and which provides for further attenuation to compensate for the non-unity gain of the accumulator 62. If the overall attenuation is by a power of two, then the amplitude-normalization circuitry 64 is simply a right-shift of the accumulator 62 output. A digital data latch 65 under control of filter control circuitry 63 may be used to latch the final amplitude-normalized accumulation result from circuitry 64 occurring before accumulator 62 is reset and to hold that result for the sequencer 25. The supplemental filter 60 averages successive outputs from the Hogenauer filter. By selectively averaging some outputs while ignoring others, the overall filter impulse response can be modified.

Consider the case of the fourth-power Hogenauer filter of FIG. 3B. Any particular output sample therefrom can be considered as the sum of the previous 4R samples of the input weighted by the impulse response, so each output sample shares some information with each of the three preceding output samples. If the sampling period is defined as being 4R input samples long (as opposed to R samples long in the conventional Hogenauer filter) and the FIG. 3B filter output signal is subsampled 4:1 so only every fourth output sample is retained, then each output sample retained will share no information with any other retained output sample. There is then no apparent sample-to-sample crosstalk. This procedure can be carried out by the supplemental filter 60 by using the filter control circuitry 63 to program the programmable attenuator 61 for weighting every fourth one of the output samples from the FIG. 3B Hogenauer filter by unity and for weighting the intervening samples by zero. The filter control circuitry 63 resets the accumulator before every fourth one of the output samples from the FIG. 3B Hogenauer filter. To retain the same output data rate while increasing the number of input samples per output sample by a factor of four requires a fourfold increase in the input sampling rate. This supplemental filtering method causes a quadrupling of the filter's equivalent noise bandwidth.

An alternative method for operating the supplemental filter 60 avoids so great an increase in the equivalent noise bandwidth of the complete sensing apparatus. The number of input samples per output sample is increased from $MR = 4R$ to $(M+N-1)R = (N+3)R$, where N is an integer larger than one. A group of N successive Hogenauer filter output samples with no apparent crosstalk are weighted by unity using the attenuator 61 under control of the filter control circuitry 63, then the next $(M-1)=3$ successive Hogenauer filter output samples in which crosstalk is apparent are weighted by zero using the attenuator 61 under control of the filter control circuitry 63. The foregoing procedure is cyclically repeated, with the accumulator 62 accumulating the weighted output samples over each cycle of $(M+N-1)=(N+3)$ output samples. The amplitude normalization circuitry 64 further attenuates the accumulator 62 result by the factor N to complete the averaging process, in addition to attenuating the accumulator 62 result by the factor $R^M$ factor; and the final average is latched to the output data latch 65 after every $(M+N-1)^{th}$ or $(N+3)^{th}$ output sample. The averaging of N successive Hogenauer filter output samples with no apparent crosstalk improves signal-to-noise and reduces noise bandwidth. However, since the noise components of the N averaged signals are not independent of each other, analytic expressions of this improvement in a readily usable form are not known to be possible. The design approach that has been taken by the inventors is to do computer simulations of the overall filter configuration.

Table 1, in FIG. 4 of the drawing, shows the equivalent noise bandwidth for various values of N. The desired output rate is 2312 Hz; R is set to 256. The required input sampling rate $f_s$ is related to the desired view rate $f_v$ according to the following relationship.

$$f_s = f_v [N+3] R; \; N \geq 1$$

Note that using the supplemental filter 60 after the Hogenauer filter having a rate change factor or oversampling ratio, R, results in a new overall rate change factor or oversampling ratio, R', for the complete sigma-delta analog-to-digital converter including supplemental filter 60. The new oversampling ratio R' is larger than the old oversampling ratio R by a factor (N+J), where J here equals power M of the Hogenauer filter less one—i.e., three. The oversampling rate in the sigma-delta analog-to-digital converter 28 is R' times the view rate $f_v$.

This method allows reduction of the noise bandwidth while retaining zero sample-to-sample crosstalk. However, in some applications the noise bandwidth may still be too high. In such cases, the inventor Wu discerned, it is possible to modify the averaging sequence to trade off a small amount of crosstalk for a significant reduction in noise bandwidth.

For Hogenauer filter powers of M, greater than one, the impulse response of the composite filter averaging N successive Hogenauer responses is such that the central portion of the $(M+N-1)R$ input samples that are weighted and summed is weighted much more heavily than the outer portions. A number R of input samples on either end of the $(M+N-1)R$ input samples will be called the tails of the input weighting. A relatively small amount of crosstalk is possible if only the tails of a particular view overlap adjacent views. That is, if the center of each sampling period coincides with the center of the impulse response for a particular view.

Consider again the case of a fourth-power filter. The number of input samples per output sample from the Hogenauer filter is kept $(M+N-1)=(N+3)R$; and the averaging sequence to allow the weighting tails of adjacent samples to overlap is to average N Hogenauer outputs, then discard $(M-2)=2$ outputs (as opposed to (M−1)=3 in the zero crosstalk case). That is, again a new oversampling ratio R' larger than the old oversampling ratio R by a factor (N+J) obtains, but J is chosen to be two smaller than the power (L+1) of the Hogenauer filter. The required input sample rate is $$f_s = f_v(N+2)R; \ N \geq 1.$$

Where N equals one, crosstalk is apparent in each of the Hogenauer filter output samples, which are not averaged using the supplemental filter 60. When N exceeds one and the supplemental filter 60 is used, crosstalk is apparent in only the initial and final one of the Hogenauer filter output samples. Accordingly, in generating the view sample in the supplemental filter 60, the crosstalk is diluted in the averaging process, owing to the averaging including the intermediate Hogenauer filter output samples in which the crosstalk is not apparent because of the successive samples being obtained from sensing only one view, rather than from sensing successive views. As the number N becomes larger, crosstalk becomes negligible, the inventor Wu discerned.

The inventor Wu went on to investigate whether, as N became larger, acceptably low crosstalk could be obtained even where there was greater overlapping of the composite filter impulse responses for successive views. Consider still again the case of a fourth-power filter. The number of input samples per output sample is decreased from (N+3)R to (N+1)R; and the averaging sequence to allow the weighting tails of adjacent samples to overlap is to average N Hogenauer outputs, then discard only (M−3)=1 output, as opposed to (M−1)=3 outputs in the zero crosstalk case. That is, again a new oversampling ratio R' larger than the old oversampling ratio R by a factor (N+J) obtains, but J is chosen to be three smaller than the power M=(L+1) of the Hogenauer filter. The sample period is redefined to begin after the first R input samples and end before the last R input samples. The required input sample rate is $$f_s = f_v(N+1)R; \ N \geq 1.$$

The (M+N−3)R input samples in the central portion of the impulse response of a current view appearing in the composite filter response will be overlapped both by a tail of R samples from the preceding view and by a tail of R samples from the succeeding view.

Table 2, in FIG. 5 of the drawing, shows the noise bandwidth and input sampling rate for various values of N with only isolated Hogenauer filter output samples being discarded, or weighted by zero, by the attenuator 61 in the supplemental filter 60. The desired output rate is again 2312 Hz. Table 2 also indicates the crosstalk for each case. The crosstalk is defined as the summation of the tails of R samples in the impulse responses from the preceding view and from the succeeding view divided by the summation of the (M+N−3)R input samples in the central portion of the impulse response of the current view.

The supplemental filtering techniques described above with regard to the Hogenauer filter are applicable in regard to other decimating filters in which the impulse response extends over a plurality of output samples. These supplemental filtering techniques are of particular interest inasfar as the Hogenauer filter is concerned, because alternatives to the Hogenauer filter offering comparable selectivity are less compact in their structure. Rather than using separable preliminary and supplemental decimation filters with a combined rate reduction factor R', a non-separable decimation filter with a rate reduction factor R' can be used instead in other embodiments of the invention.

The compactness of the sigma-delta modulator, Hogenauer filter and supplemental filter combination in a sensing apparatus similar to that described in connection with FIG. 3 lends to one such combination being used with each photosensing diode, rather than time-division multiplexed use of the sigma-delta modulator, Hogenauer filter or supplemental filter. The decimation filter codes the string of ONEs and ZEROs generated by the sigma-delta modulator to more compact digital form for application to the sequencer used in writing view memory. Apparatus for time-division multiplexing the strings of ONEs and ZEROs generated by different sigma-delta modulators to a shared decimation filter is not compact. Time-division multiplexing of analog signals from the photocurrent preamplifiers is unattractive because of the effects of such multiplexing on the impulse response of the system, because of noise introduced during such multiplexing, and because of the linearity problems encountered in the time-division multiplexing of analog signals. The claims appended to this specification are intended to cover sensing apparatus which resorts to time-division multiplexing, however.

Figure 6:
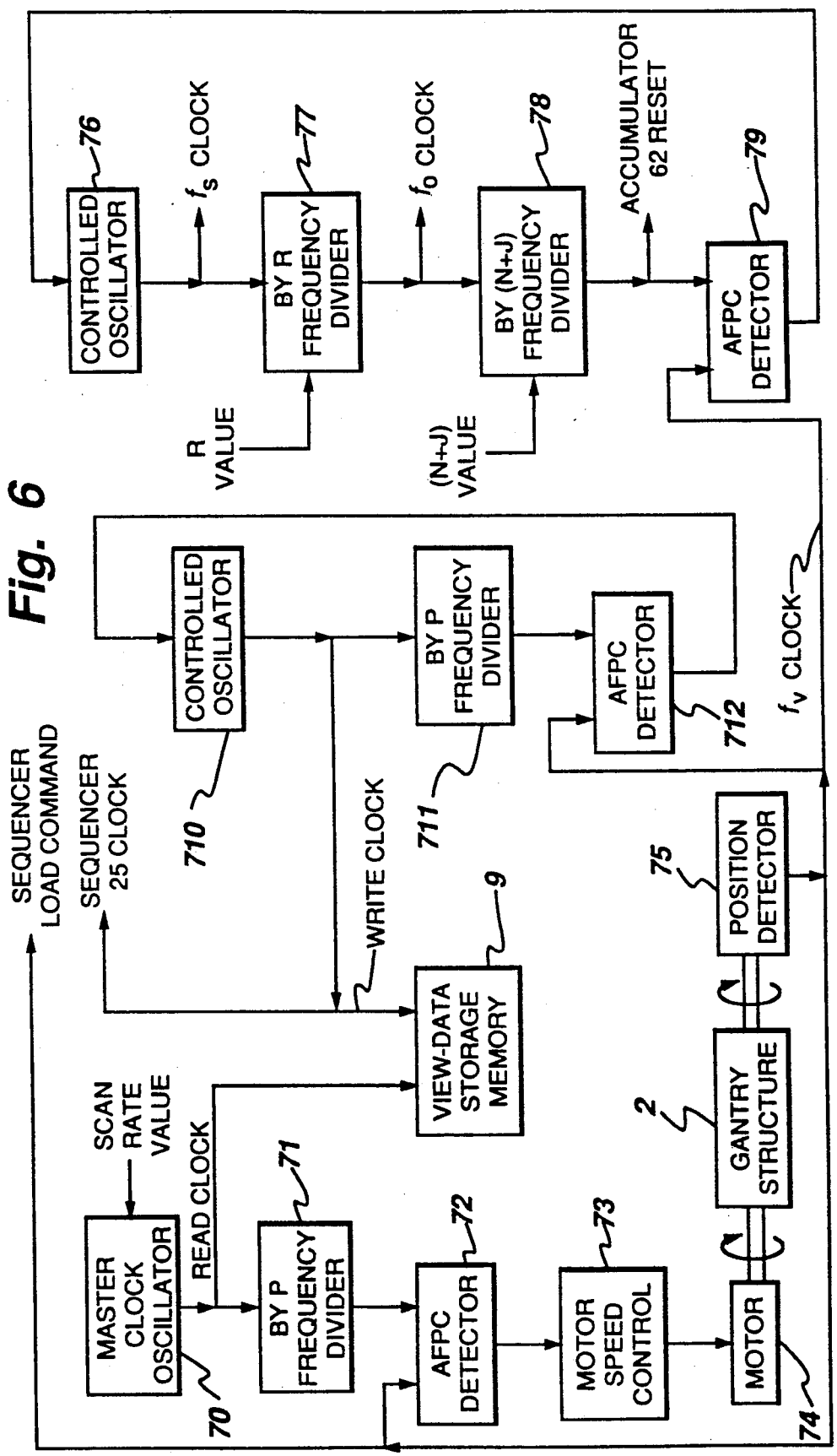
FIG. 6 is a schematic diagram of representative timing circuitry for the FIG. 1 computerized tomography scanner using sensing apparatuses per FIG. 3.

FIG. 6 shows representative timing circuitry for the FIG. 1 computerized tomography scanner using sensing apparatuses per FIG. 3. A master clock oscillator 70, typically having crystal control of its frequency of oscillation or being locked to a-c power mains frequency, generates the clocking signal for reading the view-data storage memory 9. The frequency of oscillation of the master clock oscillator 70 is shown as being adjustable to different values responsive to scan rate instructions, permitting the CT scanner operator to adjust total scan time. This clocking signal is supplied to a frequency divider 71 to be divided by a fixed integral factor P to generate a clocking signal at a nominal value of the view rate $f_v$.

(The factor P will equal the number of detector responses per view, if the view-data storage memory 9 is serially written with parallel-bit detector data, and will be the number of detector responses per view dided by an integer S, if the view-data storage memory 9 is segmented into S segments each serially written with parallel-bit detector data. If view-data storage memory 9 is written with serial-bit rather than parallel-bit detector data, P will be larger by a factor equal to the number of bits per detector datum.)

The view rate clocking signal is supplied to an automatic phase- and frequency control (AFPC) detector 72, which generates an AFPC signal supplied to motor speed control circitry 73. Responsive to this AFPC signal, the motor speed control circuitry 73 supplies electrical signals to an electric motor 74 for controlling the speed of rotation of the motor 74 and, consequently, the speed of rotation of the gantry structure 2 (and the fan-beam source 6 and the arcuate baseplate 7 attached thereto) driven by motor 74 via a mechanical connection. The gantry structure 2 by its rotation empowers a position detector 75 to generate an indication of each increment of rotation of one position in the row 8 of sensing apparatuses, which indications determine the actual value of the view rate $f_v$. By way of example, position detector 75 may be implemented by focussed light from a lamp scanning successive ones of another row of photosensors adjoining the row 8 of sensing apparatuses, with the photoresponses of other row of photosensors being combined in accordance with an OR function. The position indexing information generated at the actual view rate $f_v$ by the position detector 75 is fed back to the AFPC detector 72 to complete a feedback loop for holding the speed of rotation of the gantry structure 2 close to a value prescribed by the frequency of the clocking signals from the master clock oscillator 70.

There are some undesired minor variations of the speed of rotation of the gantry structure 2 from prescribed value, however. To accommodate these speed of rotation variations in the writing of detector data into the view-data storage memory 9, the generation of all clocking signals having to do with the writing of memory 9 is synchronized with the actual rate of rotation of the gantry structure 2, rather than to its prescribed rate of rotation.

Towards this goal, the oscillations of a controlled oscillator 76 generating the $f_s$ clock at oversampling rate for the sigma-delta modulator 28, as successively scaled down in frequency by the factors R and (N+J) in cascaded programmable frequency dividers 77 and 78 respectively, are supplied as input signal to an AFPC detector 79. The AFPC detector 79 receives another input signal the actual view rate $f_v$ output signal from the position detector 75 and generates an output signal used to control the frequency of the oscillations of the oscillator. This completes a feedback loop that regulates the reset signal for accumulator 62, supplied as an output signal from the programmable frequency divider 78, to equal the actual view rate $f_v$.

The same feedback loop also regulates the $f_o$ clock frequency to be (N+J) times the actual view rate $f_v$ as determined by the (N+J) value programmed into the programmable frequency divider 78. The $f_o$ clock frequency is supplied to the R:1 subsampler 55, the differentiators 56–59 of the Hogenauer filter and the accumulator 62 in the supplemental filter 60 as the accumulator clocking signal.

The same feedback loop also regulates the $f_s$ clock frequency to be R times the $f_o$ clock frequency as determined by the R value programmed into the programmable frequency divider 77—which is to say, R(N+J) times the actual view rate $f_v$ as determined by the R and (N+J) values respectively programmed into the programmable frequency dividers 77 and 78. The $f_s$ clock frequency is supplied to the sigma-delta modulators 30 and 40 and to the integrators 51–54 of the Hogenauer filter, as well as to the programmable frequency divider 78.

Further to accommodate gantry structure 2 speed of rotation variations in the writing of detector data into the view-data storage memory 9, the generation of the clocking signal for the writing of the memory 9 itself is made to be a multiple P of the actual actual value of the view rate $f_v$, rather than to its prescribed value. To do this, the oscillations of a controlled oscillator 710 generating the clocking signal for the writing of the memory 9, as divided by the integer P in a frequency divider 711, are supplied as input signal to an AFPC detector 712, receiving as another input signal the actual view rate $f_v$ output signal from the position detector 75 and generating an output signal used to control the frequency of the oscillations of the oscillator 710. The clocking signals from the controlled oscillator 710 are supplied to each sequencer 25, as well as being supplied as writing clock signals to the memory 9, so sequencer 25 reading is synchronized with memory 9 writing.

The oversampling rate $f_s$ of the sigma-delta modulators 30 and 40 and the output sample rate $f_o$ of the FIG. 3B Hogenauer filters vary depending on the way the supplemental filters 60 are operated and on the oversampling ratio R being used. The frequency divider 77 is programmed to divide by the integral factor R, which can be made larger as the view rate is made smaller responsive to the scan rate programmed into the master clock generator 70. The frequency divider 78 is programmed to divide by an integral factor (N+J) at least (N+L) and preferably equal to (N+L), if no crosstalk is to be allowed in the output signals of the decimation filters, and somewhat smaller than (N+L), if some crosstalk is to be allowed in the output signals of the decimation filters. The programming of the frequency dividers 77 and 78 may be under manual control by the CT scanner operator or may be automatically controlled in accordance with the choice of total scan time made by the CT scanner operator.

A number of variations of the FIG. 6 timing circuitry will, of course, occur to one skilled in the art and acquainted with FIG. 6 and the foregoing description thereof.

The preamplifier 21 shown in FIGS. 2 and 3 is a transresistance amplifier and for photodiodes with appreciable capacitance has less noise than the photodiode shot noise. As the capacitances of the photodiodes are reduced, using the device design techniques as described above, the primary sources of wideband noise accompanying the preamplifier output signal are within the preamplifier itself (and from the x-ray quantum noise in a CT scanner). Further, reduction of the wideband noise requires improvements in the design of the preamplifier itself. When the capacitances of the photodiodes are reduced sufficiently, from the standpoint of reducing wideband noise, Miller integrators, rather than transresistance amplifiers, become advantageous to use as preamplifiers after the photodiodes.

Operational amplifiers are connected as Miller integrators by being provided with Miller-feedback capacitors in their respective degenerative feedback connections. Replacing the feedback resistors of the transresistance preamplifiers with Miller-feedback capacitors removes the thermal noise of the feedback resistors as components of the wide-band noise accompanying the preamplifier output signals.

The Riemann integral response a Miller integrator has to a "rectangular" pulse of photocharge generated during each view of CT scan is a sawtooth or ramp voltage, presuming the Miller integrator is reset at the beginning of each view. Conventionally, when a Miller integrator is used for pre-amplification before an analog-to-digital conversion is performed, this sawtooth or ramp voltage is sampled at or near its peak and the sample is held to the next sampling, in a synchronous peak-detection procedure. The peak-detection result is then digitized by an A/D converter to facilitate its storage in a memory for detector responses. Designers have preferred to use correlated double sampling of the ramp voltage when carrying out the synchronous peak-detection procedure. An initial one of the correlated samples is taken at the outset of the integration period, just after reset and before the "rectangular" pulse of photocharge begins to be integrated, and a final one of the correlated samples is taken at or near the peak of the ramp voltage, just before the Miller integrator is reset again. Then subtraction of the initial sample from the final sample cancels the effect of reset noise in the peak-detection result.

The synchronous peak-detection procedure of the prior art causes undesirably aliasing of the wideband noise arising from the field-effect transistors in the input stage of the operational amplifier (and from the x-ray quantum noise in a CT scanner) translating to baseband the wideband noise from the spectra flanking the output sample frequency $f_v$ or multiple thereof that is the carrier frequency for the synchronous peak-detection procedure. The inventor Ribner perceived that the filtering associated with an A/D converter of oversampling type allows one to avoid having to do the synchronous peak-detection procedure. The ramp outputs from the integrating preamplifier can be applied directly to the sigma-delta A/D converter, rather than being synchronously detected beforehand, and the low-pass digital filtering afforded by the decimation filter of the sigma-delta A/D converter will extract an averaged response to the samples taken at oversampling rate of each ramp output. That is, an average detection procedure replaces the peak detection; and, by assuring that the ramping during integration is linear, a predictable relationship between the average detection result(s) and the peak detection result can be determined that will enable the peak detection result to be calculated proceeding from the average detection result(s). In implementing the invention with an integrating preamplifier, then, the prior-art synchronous peak-detection procedure is not followed when a Miller integrator is used as a preamplifier, and the correlated double sampling procedure is different from the prior-art one.

Figure 7:
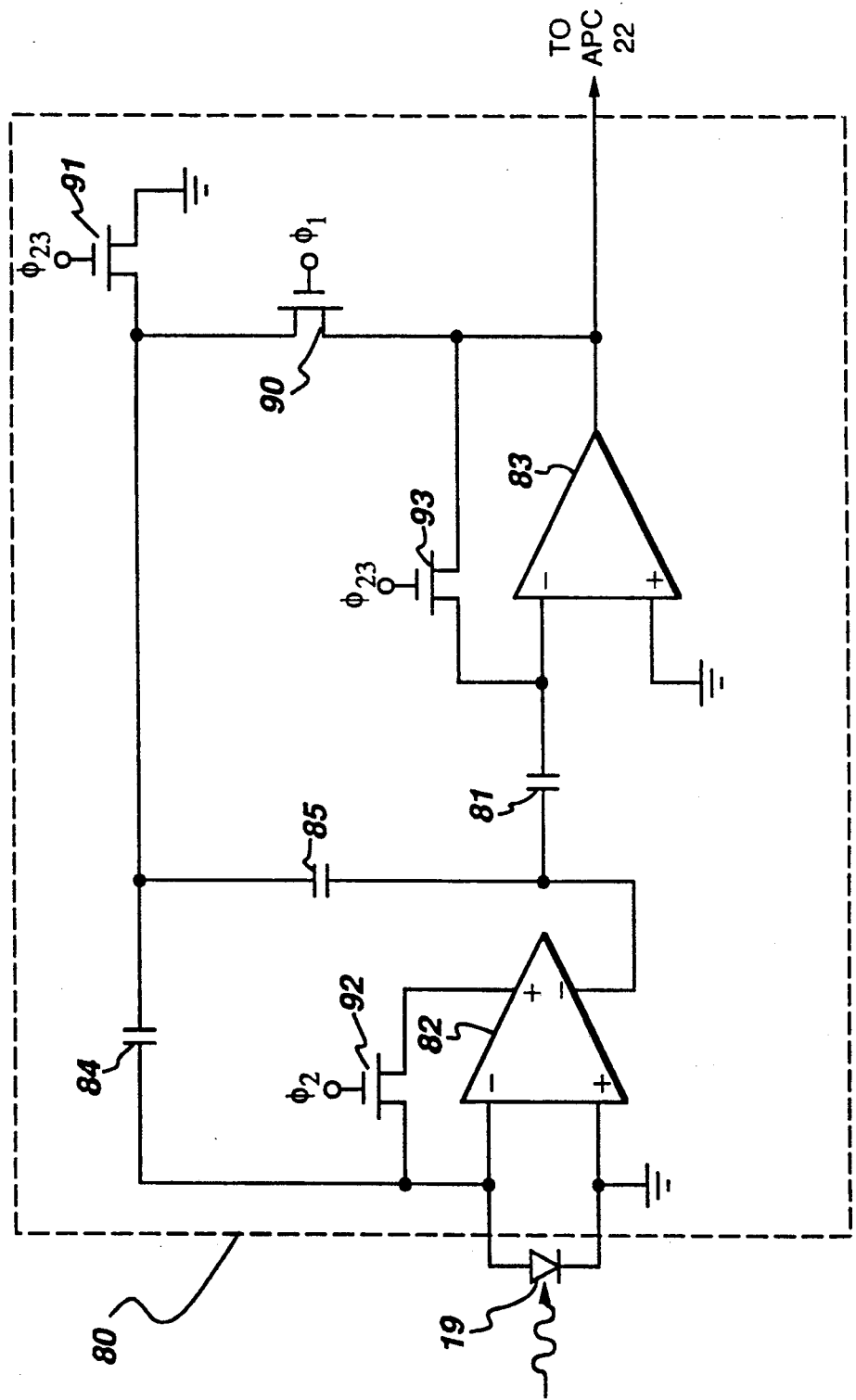
FIG. 7 is a schematic diagram of an integrating preamplifier that may be used after the photodiode instead of a transresistive preamplifier in modifications of the FIGS. 2 and 3 sensing apparatuses that are other embodiments of the invention.
Figure 8:
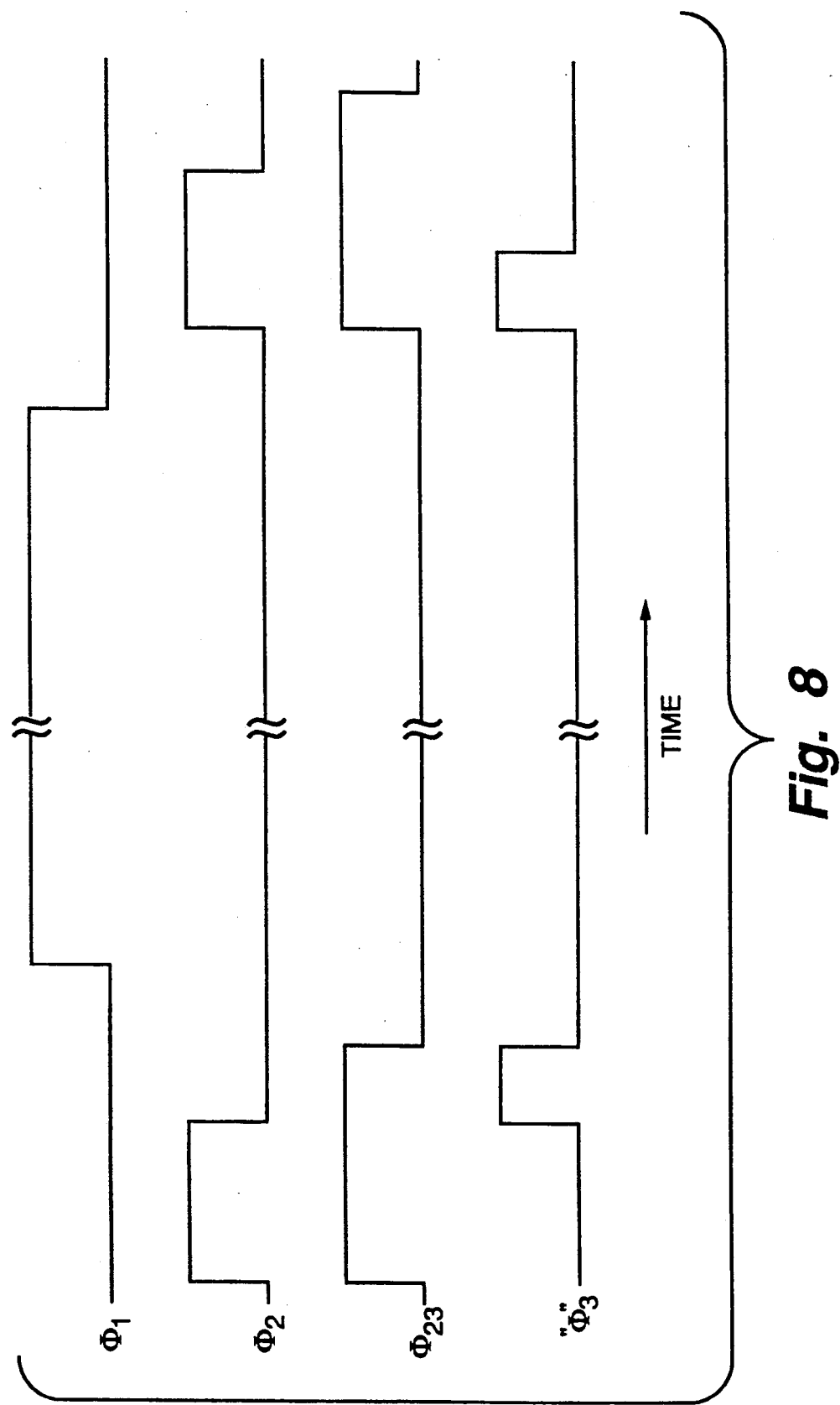
FIG. 8 is a timing diagram of the resetting procedures for the FIG. 7 integrating preamplifier.

FIG. 7 shows a single-ended integrating preamplifier 80 for implementing this procedure. Preamplifier 80 replaces the transresistance preamplifier 21 between the photodiode 19 and the oversampling sigma-delta modulator 22 in the FIG. 2 sensing apparatus or the modulator 28 in the FIG. 3 sensing apparatus. The single-ended integrating preamplifier 80 is similar to a single-ended integrating preamplifier described in the above-cited U.S. patent application filed by David B. Ribner and entitled "NOISE-CANCELLING PHOTODETECTOR PREAMPLIFIER, AS FOR COMPUTERIZED TOMOGRAPHY"; and balanced homologs of the single-ended integrating preamplifier 80, as described in that application, can be used instead of the single-ended integrating preamplifier 80 in other sensing apparatuses embodimenting the invention.

The single-ended integrating preamplifier 80 applies the ramp signals from its output connection directly to the sigma-delta A/D modulator 22 or 28, without any intervening synchronous detection procedure. Preamplifier 80 includes, in cascade connection with a dc-blocking capacitor 81 between them, a differential-input/differential-output transconductance amplifier 82 and a differential-input voltage amplifier 83. During normal operation, when a first-phase binary-valued control voltage $\phi_1$ is high, a capacitor 84 is selectively connected to provide degenerative voltage feedback from the output connection of the differential-input voltage amplifier 83 to the input connection of the differential-input/differential-output transconductance amplifier 82. That is, the capacitor 84 provides the Miller feedback capacitor for completing the connection of the cascaded amplifiers 82 and 83 as a Miller integrator. While a field-efffect-transistor switch 90 is conductive during normal operation, responsive to the first-phase binary-valued control voltage $\phi_1$ being high, a field-efffect-transistor switch 92 is non-conductive responsive to a second-phase binary-valued control voltage $\phi_2$ being low, and field-efffect-transistor switches 91 and 93 are non-conductive responsive to another phase binary-valued control voltage $\phi_{23}$ being low. A capacitor 85 completes a local degenerative voltage feedback loop around voltage amplifier 83 operative for high frequencies in a pole-splitting phase compensation scheme.

The resetting procedure for the integrating preamplifier 80 is of interest; it involves a correlated double sampling that suppresses flicker (or 1/f, x-ray quantization noise and KT/C noise otherwise appearing in the lower frequency spectrum of the preamplifier 80 output signal and arising in the metal-oxide-semiconductor field-effect transistors of the preamplifier 80, particularly those in the input stage of the voltage amplifier 81 at the outset of the voltage-amplifier cascade. Throughout resetting, the first-phase binary-valued control voltage $\phi_1$ is low, so the FET switch 90 is non-conductive, thereby to interrupt Miller integration. Throughout resetting, the FET switch 91 is conductive responsive to binary-valued control voltage $\phi_{23}$ being high, which clamps the righthand plate of the capacitor 84 to ground.

During the initial portion of the resetting operation, the FET switch 92 is conductive responsive to a second-phase binary-valued control voltage $\phi_2$ being high. This connects the differential-input/differential-output transconductance amplifier 82 for auto-zeroing, the degenerative feedback through the FET switch 92 causing the charging of the capacitor 84 to a voltage substantially equal to the input referred offset and noise voltage of the amplifier 82, to avoid the response to those terms appearing at the output connection of the amplifier 82 being amplified by a factor larger than one. The auto-zeroing of amplifier 82 places its +output connection at a voltage substantially equal to the input referred offset and noise voltage of the amplifier 82, and its −output connection at a voltage substantially equal to the negative of the input referred offset and noise voltage of the amplifier 82 is applied to the lefthand plate of the dc-blocking capacitor 87. The conduction of FET switch 93 connects the differential-input voltage amplifier 83 for auto-zeroing, the degenerative feedback through the FET switch 93 causing the charging of the capacitor 81 to place the input referred offset and noise voltage of the amplifier 83 on the righthand plate thereof, to avoid the response to those terms appearing at the output connection of the amplifier 83 being amplified by a factor larger than one.

During the final portion of the resetting operation, the FET switch 92 is rendered non-conductive responsive to the second-phase binary-valued control voltage $\phi_2$ going low. (This final portion of the resetting operation may be considered a third phase of operation when a third-phase binary-valued control voltage $\phi_3$ is high, with the control voltage $\phi_{23}$ being the OR response to control voltages $\phi_2$ and $\phi_3$.) The charge injection into capacitor 84 from the opening of the FET switch 92 alters the voltage applied to the right hand plate of the dc-blocking capacitor 81 during this third phase of operation. The autozeroing of amplifier 83 charges capacitor 81 to compensate for this alteration. The only residual offset error when the FET switches 91 and 93 become non-conductive at the close of the resetting operation is from the charge injection into capacitor 81 from the opening of the FET switch 93 responsive to control voltage $\phi_2$ going low. As referred to the input port of the transconductance amplifier 82, however, this error is reduced by the voltage gain of the transconductance amplifier 82 as loaded by the voltage amplifier 83 input port. After resetting, normal operation is resumed, with FET switch 90 being returned to conduction responsive to the first-phase binary-valued control voltage $\phi_1$ being high, thereby to re-connect capacitor 84 to complete the feedback loop for the Miller integrator.

The resetting procedure set forth above is carried out at the beginning of each view in each of the Miller integrators respectively associated with the various photodetectors, during the time its sigma-delta modulator 28 is generating output samples that are to be discarded anyway because of crosstalk from the previous view. The standard deviation of the noise generated in pre-amplifier 80 as referred to its input does not change with lengthened integration time. The sigma-delta modulator 28 receives this noise as amplified in the pre-amplifier 80 by the factor one plus the ratio of the capacitive reactance of capacitor 84 to that of the photodiode 19—i.e. by one plus the ratio of the capacitance of the photodiode 19 to that of capacitor 84. Accordingly, the capacitance of the photodiode 19 is made smaller than that of capacitor 84. The standard deviation of the quantizing noise generated in the sigma-delta modulator 28 does not change with lengthened integration time, either. There is no integration of noise accompanying the converted signal from the sigma-delta modulator 28 during the view. The photocurrent from the photodiode 19 is integrated by the pre-amplifier during the view, to improve signal-to-noise ratio with lengthening integration time, which is why the Miller integrator is preferably reset at view rate rather than at output sample rate from the Hogenauer filter.

The application of ramp voltages rather than "rectangular pulses" to the sigma-delta modulator 28 in FIG. 3 sensing apparatus modified per FIG. 7 requires change be made in the scaling factor employed in the amplitude normalization circuitry 65 (of FIG. 3C). When averaging N of every (N+J) output samples is done in the supplemental filter 60 of FIG. 3C, by dividing the summation of the $(J+1)^{th}$ through $(N+J)^{th}$ samples during the ramp by the factor (N+J-L+1) expressing the number of those samples, multiplying that average by two will yield a value equal to the final value $V_R(nT)$ of the ramp. This correction factor can, for example, be figured into the amplitude normalization factor applied to decimation filter response in circuitry 64 of the supplemental filter 60 shown in FIG. 3C.

The filtered noise bandwidth of the FIG. 3 sensing apparatus modified to include the FIG. 7 Miller integrator pre-amplifier 80 is approximately (N+J)/2T Hertz, where T is the ramp period in seconds. The broad-band noise from the integrating pre-amplifier 80 is attenuated by a factor of $[(N+J)R]^{0.5}$.

While only certain preferred features of the invention have been illustrated and described herein, many modifications and changes will occur to those skilled in the art in light of the teaching of this specification. It is, therefore, to be understood that the appended claims are intended to cover all such modifications and changes as fall within the true spirit of the invention.

What is claimed is:

1. Sensing apparatus comprising:

a photosensor for responding to a respective element of a radiant-energy image for at least a prescribed period of time to generate a photocurrent, said prescribed period being the reciprocal of a view rate;

a preamplifier having an input port connected for receiving photocurrent from said photosensor and having an output port for supplying an analog output signal responsive to the photocurrent its input port receives, which output signal is undesirably accompanied by wideband noise originating in substantial part within said preamplifier;

a sigma-delta modulator of order L, having an input port connected for receiving an analog input signal, and having an output port for supplying at an oversampling rate digital responses to said analog input signal, which responses are accompanied by quantizing noise generated within said sigma-delta modulator, L being an integer larger than zero, said oversampling rate being R' times said view rate, and R' being an integer greater than one;

means for applying to the input port of said sigma-delta modulator as its said received input signal the analog output signal from the output port of said preamplifier and an aboveband component consisting of at least a portion of said accompanying wideband noise, whereby the digital response of said sigma-delta modulator is accompanied by undesirable response to said aboveband component as well as the quantizing noise generated within said sigma-delta modulator; and a decimation filter having an input port connected from the output port of said sigma-delta modulator and having an output port for supplying a decimation filter response at said view rate, in which decimation filter response a component corresponding to said aboveband component is attenuated respective to a component corresponding to the preamplifier analog output signal as well as the quantizing noise generated within said sigma-delta modulator being attenuated respective to the component corresponding to the preamplifier analog output signal.

2. Sensing apparatus as set forth in claim 1 wherein said means for applying to the input port of said sigma-delta modulator the analog output signal from the output port of said preamplifier and at least a portion of the accompanying wideband noise originating in substantial part within said preamplifier essentially consists of a direct connection from the output port of said preamplifier to the input port of said sigma-delta modulator.

3. Sensing apparatus as set forth in claim 1 wherein said preamplifier is a transimpedance amplifier.

4. Sensing apparatus as set forth in claim 1 wherein said decimation filter comprises an accumulator for the digital responses of said sigma-delta modulator, said accumulator being periodically reset at said view rate.

5. Sensing apparatus as set forth in claim 1 wherein said sigma-delta modulator is of a type supplying its digital response to said integrated error signal in bit-serial format and wherein said decimation filter comprises a counter for counting the ONEs in the digital response of said sigma-delta modulator, said counter being periodically reset at said view rate.

6. Sensing apparatus as set forth in claim 1 wherein said means for applying to the input port of said sigma-delta modulator the analog output signal from the output port of said preamplifier and at least a portion of the accompanying wideband noise originating in substantial part within said preamplifier is a low-pass analog filter.

7. Sensing apparatus as set forth in claim 1 wherein said decimation filter includes:

a finite-impulse-response low-pass digital filter having an input port to which said sigma-delta modulator digital response is supplied and having an output port for supplying a digital filter response, which digital filter response is supplied at an output sample rate and is substantially free of said quantizing noise and of said wideband noise above said output sample rate, said digital filter being of a type having a kernel with a width of R samples, R being no larger than R'; and means for sampling said digital filter response at said view rate to generate said decimation filter response.

8. Sensing apparatus as set forth in claim 7 wherein said finite-impulse-response low-pass digital filter is of a type having a $\text{sinc}^{(L+1)}(\omega T)$ transfer characteristic, R being an integer no larger than $R'/(L+1)$.

9. Sensing apparatus as set forth in claim 8 wherein said finite-impulse-response low-pass digital filter is a Hogenauer filter.

10. Sensing apparatus as set forth in claim 8 wherein R equals $R'/(L+1)$, wherein said output sample rate is $1/(L+1)$ times said oversampling rate, and wherein said means for sampling said digital filter response at view rate samples said digital filter response only when the current sample of said digital filter response and the L samples most immediately preceding it all originate during the same prescribed period.

11. Sensing apparatus as set forth in claim 8 wherein R equals $R'/(N+L+1)$, N being a positive integer; wherein said output sample rate is $1/(N+L+1)$ times said oversampling rate; and wherein said means for sampling said digital filter response at view rate is a supplemental filter that averages each group of N said digital filter responses that occur during N successive intervals occurring at said output sample rate when the current sample of said digital filter response and the L samples most immediately preceding it all originate during the same prescribed period of time.

12. Sensing apparatus as set forth in claim 8 wherein R equals $R'/(N+J)$, N being a positive integer and J being a positive integer less than $(L+1)$; wherein said output sample rate is $1/(N+J)$ times said oversampling rate and wherein said means for sampling said digital filter response at view rate is a supplemental filter that averages each group of $N+J-(L+1)$ said digital filter responses that occur during $N+J-(L+1)$ successive intervals occurring at said output sample rate including N successive intervals when the current sample of said digital filter response and the L samples most immediately preceding it all originate during the same prescribed period of time.

13. Sensing apparatus as set forth in claim 10, 11 or 12 wherein said preamplifier is a Miller integrator periodically reset at said output sample rate.

14. Sensing apparatus as set forth in claim 10, 11 or 12 including means for adjustably determining R'.

15. Sensing apparatus as set forth in claim 14 incorporated into a computerized tomography scanner together with other sensing apparatuses of its like and with respective scintillators for each said photosensor, said computerized tomography scanner having means for moving an x-ray beam through successive positions vis-a-vis each scintillator during a succession of view times thereby causing said scintillators to generate said respective elements of a radiant-energy image for each successive view time.

16. Sensing apparatus as set forth in claim 14 wherein said sigma-delta modulator is of a type supplying its digital response to said integrated error signal in bit-serial format, said sensing apparatus incorporated into a computerized tomography scanner together with other sensing apparatuses of its like and with respective scintillators for each said photosensor, said computerized tomography scanner having means for moving an x-ray beam through successive positions vis-a-vis each scintillator during a succession of view times thereby causing said scintillators to generate said respective elements of a radiant-energy image for each successive view time.

17. Sensing apparatus as set forth in claim 1, 7, 10, 11 or 12 wherein said means for applying to the input port of said sigma-delta modulator the analog output signal from the output port of said preamplifier and at least a portion of the accompanying wideband noise originating in substantial part within said preamplifier is a direct connection from the output port of said preamplifier to the input port of said sigma-delta modulator, and wherein said preamplifier is of a type including therewithin means for rolling off the frequency spectrum of said wideband noise originating in substantial part within said preamplifier at frequencies above said output sample rate, thereby to avoid aliasing in said sigma-delta modulator of wideband noise to frequencies below said output sample rate.

18. Sensing apparatus as set forth in claim 17 included in a combination with other sensing apparatuses of its like, said combination further comprising:

a digital bus;

means for applying respective elements of the same radiant-energy image to the respective said photosensors of the sensing apparatuses in said combination for them respectively to respond to; and means for time-division-multiplexing together for application to said digital bus the digital responses of the respective sigma-delta modulators of the sensing apparatuses in said combination.

19. Sensing apparatus as set forth in claim 1, 7, 10, 11 or 12 wherein said means for applying to the input port of said sigma-delta modulator the analog output signal from the output port of said preamplifier and at least a portion of the accompanying wideband noise originating in substantial part within said preamplifier includes:

a low-pass analog filter having a corner frequency above said output sample rate but below said oversampling rate.

20. Sensing apparatus as set forth in claim 19 included in a combination with other sensing apparatuses of its like, said combination further comprising:

a digital bus;

means for applying respective elements of the same radiant-energy image to the respective said photosensors of the sensing apparatuses in said combination for them respectively to respond to; and means for time-division-multiplexing together for application to said digital bus the digital responses of the respective sigma-delta modulators of the sensing apparatuses in said combination.

21. Sensing apparatus as set forth in claim 1, 7, 10, 11 or 12 wherein said sigma-delta modulator is a higher-order sigma-delta modulator in which L is at least two.

22. Sensing apparatus as set forth in claim 21 incorporated into a computerized tomography scanner together with other sensing apparatuses of its like and with respective scintillators for each said photosensor, said computerized tomography scanner having means for moving an x-ray beam through successive positions vis-a-vis each scintillator during a succession of view times thereby causing said scintillators to generate said respective elements of a radiant-energy image for each successive view time.

23. Sensing apparatus as set forth in claim 21 wherein said sigma-delta modulator is a third-order sigma-delta modulator, in which L is three, which said third-order sigma-delta modulator comprises:
- a first integrator, having an input port for receiving a first error signal, and having an output port for supplying integrated first error signal;
- a second integrator, having an input port for receiving a second error signal, and having an output port integrated second error signal;
- a third integrator, having an input port for receiving a second error signal, and having an output port integrated third error signal;
- a first quantizer, having an input port connected from the output port of said second integrator, and having an output port for supplying a first digital output signal;
- a second quantizer, having an input port connected from the output port of said third integrator, and having an output port for supplying a second digital output signal;
- means for subtractively combining in specified proportions said first digital output signal as placed into analog form and said analog input signal to said sigma-delta modulator, to generate said first error signal, thereby completing a first feedback loop;
- means for subtractively combining in specified proportions said first digital output signal as placed into analog form and said integrated first error signal, to generate said second error signal, thereby completing a second feedback loop, said first and second feedback loops co-operative to cause said first digital output signal to correspond to said analog input signal to said sigma-delta modulator plus a second-order differential quantization noise component and to cause said integrated second error signal to correspond to said first digital output signal less said second-order differential quantization noise component;
- means for subtractively combining in specified proportions said second digital output signal as placed into analog form and said integrated second error signal, to generate said third error signal, thereby completing a third feedback loop operative to cause said second digital output signal to correspond to the negative of said second-order differential quantization noise component plus a third-order differential quantization noise component; and
- means for combining said first and second digital output signals to generate the digital response of said sigma-delta modulator corresponding to said analog input signal essentially free of second-order quantization noise.

24. Sensing apparatus as set forth in claim 23 incorporated into a computerized tomography scanner together with other sensing apparatuses of its like and with respective scintillators for each said photosensor, said computerized tomography scanner having means for moving an x-ray beam through successive positions vis-a-vis each scintillator during a succession of view times thereby causing said scintillators to generate said respective elements of a radiant-energy image for each successive view time.

25. Sensing apparatus as set forth in claim 1, 7, 10, 11 or 12 incorporated into a computerized tomography scanner together with other sensing apparatuses of its like and with respective scintillators for each said photosensor, said computerized tomography scanner having means for moving an x-ray beam through successive positions vis-a-vis each scintillator during a succession of view times thereby causing said scintillators to generate said respective elements of a radiant-energy image for each successive view time.

26. Sensing apparatus as set forth in claim 1, 7, 10, 11 or 12 wherein said sigma-delta modulator is of a type supplying its digital response to said integrated error signal in bit-serial format, said sensing apparatus incorporated into a computerized tomography scanner together with other sensing apparatuses of its like and with respective scintillators for each said photosensor, said computerized tomography scanner having means for moving an x-ray beam through successive positions vis-a-vis each scintillator during a succession of view times thereby causing said scintillators to generate said respective elements of a radiant-energy image for each successive view time.

27. Sensing apparatus as set forth in claim 1, 7, 10, 11 or 12 wherein said sigma-delta modulator is of a type supplying its digital response to said integrated error signal in bit-serial format.

28. Sensing apparatus as set forth in claim 27 incorporated into a computerized tomography scanner together with other sensing apparatuses of its like and with respective scintillators for each said photosensor, said computerized tomography scanner having means for moving an x-ray beam through successive positions vis-a-vis each scintillator during a succession of view times thereby causing said scintillators to generate said respective elements of a radiant-energy image for each successive view time.

29. Sensing apparatus as set forth in claim 1 wherein said preamplifier is a Miller integrator periodically reset at a multiple of said view rate.

30. Sensing apparatus comprising:
- a photosensor for responding to a respective element of a radiant-energy image for at least a prescribed period of time to generate a photocurrent;
- a preamplifier having an input port connected for receiving photocurrent from said photosensor and having an output port for supplying an analog output signal responsive to the photocurrent its input port receives, which output signal is undesirably accompanied by wideband noise originating in substantial part within said preamplifier;
- a sigma-delta modulator of order L, having an input port connected for receiving an analog input signal, and having an output port for supplying at an oversampling rate digital responses to said analog input signal, which responses are accompanied by quantizing noise generated within said sigma-delta modulator, L being an integer larger than zero;
- means for applying to the input port of said sigma-delta modulator as its said received input signal the analog output signal from the output port of said preamplifier and an aboveband component consisting of at least a portion of said accompanying wideband noise, whereby the digital response of said sigma-delta modulator is accompanied by undesirable response to said aboveband component as well as the quantizing noise generated within said sigma-delta modulator;

a decimation filter having an input port connected from the output port of said said sigma-delta modulator and having an output port for supplying a decimation filter response at an output sample rate that is a submultiple of said oversampling rate, said oversampling rate being R' times said output sample rate, R' being an integer greater than one, in which decimation filter response a component corresponding to said aboveband component is attenuated respective to a component corresponding to the preamplifier analog output signal as well as the quantizing noise generated within said sigma-delta modulator being attenuated respective to the component corresponding to the preamplifier analog output signal; and means for adjustably determining R'.

31. Sensing apparatus comprising:

a photosensor for responding to a respective element of a radiant-energy image for at least a prescribed period of time to generate a photocurrent;

a preamplifier for generating an analog output signal responsive to the photocurrent of said photosensor which output signal is undesirably accompanied by wideband noise originating in substantial part within said preamplifier;

an analog filter for responding to the output signal of said preamplifier with a response in which said wideband noise above a cut-off frequency is suppressed;

a sigma-delta modulator of order L, having an input port connected for receiving an analog input signal, and having an output port for supplying at an oversampling rate digital responses to said analog input signal, which responses are accompanied by quantizing noise generated within said sigma-delta modulator, L being an integer larger than zero;

a subsampler for sampling at an output sample rate that is a submultiple of said oversampling frequency and that is below said cut-off frequency, from which subsampler an output signal for said sensing apparatus is to be taken; and a finite-impulse-response low-pass digital filter for said sigma-delta modulator digital responses for supplying to said subsampler a response to said sigma-delta modulator digital responses substantially free of said quantizing noise and of said wideband noise above said output sample rate.

* * * * *